(12) United States Patent
Kong et al.

(10) Patent No.: US 12,124,242 B2
(45) Date of Patent: Oct. 22, 2024

(54) MOTOR ANGLE DETECTION AND DIAGNOSIS APPARATUS, MOTOR CONTROLLER, ELECTRIC VEHICLE, AND METHOD

(71) Applicant: Huawei Digital Power Technologies Co., Ltd., Guangdong (CN)

(72) Inventors: Xuejuan Kong, Dongguan (CN); Zhen Fang, Dongguan (CN); Lihua Liu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 145 days.

(21) Appl. No.: 17/994,529

(22) Filed: Nov. 28, 2022

(65) Prior Publication Data

US 2023/0085935 A1  Mar. 23, 2023

Related U.S. Application Data

(63) Continuation of application No. PCT/CN2020/092990, filed on May 28, 2020.

(51) Int. Cl.
*G05B 19/4155* (2006.01)
*G01B 7/30* (2006.01)
(Continued)

(52) U.S. Cl.
CPC .......... *G05B 19/4155* (2013.01); *G01B 7/30* (2013.01); *G01D 5/20* (2013.01); *G01R 31/343* (2013.01); *G05B 2219/41329* (2013.01)

(58) Field of Classification Search
CPC ...... G05B 19/4155; G05B 2219/41329; G01B 7/30; G01D 5/20; G01R 31/343;
(Continued)

(56) References Cited

U.S. PATENT DOCUMENTS 8,810,175 B2 * 8/2014 Kawano ................. B62D 5/046
318/434
9,325,263 B1   4/2016 Costanzo et al.
(Continued)

FOREIGN PATENT DOCUMENTS

CN   103253304 A   8/2013
CN   108566133 A   9/2018
CN   111038575 A   4/2020

OTHER PUBLICATIONS

Murray A et al.: "Resolver position sensing system with integrated fault detection for automotive applications", Proceedings of IEEE Sensors 2002. Orlando, FL, Jun. 12-14, 2002; [IEEE International Conference on Sensors], New York, NY: IEEE, US, vol. 2, Jun. 12, 2002 (Jun. 12, 2002), pp. 864-869, XP010605220, Total 6 Pages.

*Primary Examiner* — David Luo
(74) *Attorney, Agent, or Firm* — Gregg Jansen

(57) ABSTRACT

A motor angle detection and diagnosis apparatus is connected to a drive motor using a resolver. The resolver is configured to output a resolver feedback signal of an electrical angle of the drive motor. An angle sampling and diagnosis system in the motor angle detection and diagnosis apparatus performs two-channel simultaneous sampling on a resolver feedback signal, obtained after adjustment by the resolver feedback processing circuit, separately calculates a first electrical angle and a second electrical angle; diagnoses data obtained after the two-channel sampling of the first electrical angle and the second electrical angle in real time, diagnoses hardware circuits, and controls the motor controller to enter a safe state when a diagnosis result is abnormal. In this solution, sampling is performed by using two sampling channels, so that angle decoding of at least an ASIL C can be implemented.

30 Claims, 11 Drawing Sheets

(51) Int. Cl.
*G01D 5/20* (2006.01)
*G01R 31/34* (2020.01)
(58) Field of Classification Search
CPC .... H02P 6/16; H02P 6/17; H02P 21/18; H02P 23/14; H02P 23/18; H02P 6/08; H02P 27/06
USPC ................................ 318/605, 604, 600, 560
See application file for complete search history.

(56) References Cited

U.S. PATENT DOCUMENTS

2016/0126873 A1   5/2016   Costanzo et al.
2020/0114967 A1   4/2020   Nakajima et al.

\* cited by examiner

MOTOR ANGLE DETECTION AND DIAGNOSIS APPARATUS, MOTOR CONTROLLER, ELECTRIC VEHICLE, AND METHOD

CROSS-REFERENCE TO RELATED APPLICATIONS

This application is a continuation of International Application No. PCT/CN2020/092990, filed on May 28, 2020, the disclosure of which is hereby incorporated by reference in its entirety.

TECHNICAL FIELD

This application relates to the field of in-vehicle motor control technologies, and in particular, to a motor angle detection and diagnosis apparatus, a motor controller, an electric vehicle, and a motor angle detection and diagnosis method.

BACKGROUND

ISO 26262 Road Vehicle Function Safety is a road vehicle function safety standard, and is an international standard derived from the basic function safety standard IEC61508 of electronics, electrical, and programmable components, mainly for components used in the automotive field, such as electrical components, electronic devices, and programmable electronic components in the automotive industry, and intended for improving safety of functions of automotive electronics and electrical products. This standard determines a safety requirement level (Automotive Safety Integrity Level, vehicle safety integrity level ASIL) for a system or a component of the system based on a safety risk degree, where safety requirement levels vary from A to D, and the level D is a highest level. A higher ASIL level indicates higher diagnosis coverage of a circuit related to function safety and a lower corresponding hardware random failure probability metric.

Torque safety is a most important function safety goal of a motor controller of an electric vehicle, and is generally defined as no unexpected torque acceleration or deceleration, or unexpected startup. A highest torque function safety goal ASIL level of the motor controller reaches at least an ASIL C or an ASIL D. To enable a torque safety goal level to reach at least the ASIL C, an input quantity (an electrical angle of a motor) that needs to be used to calculate torque needs to reach at least the ASIL C.

In the field of electric vehicles, electric resolvers (referred to as resolvers) are generally used to test a rotor position and a rotation speed of a motor due to reliable working and strong environment adaptability. The resolver is a sensor that accurately measures an angular position and speed of a rotation component such as a motor through a magnetic coupling effect between a primary winding and two secondary windings. The primary winding and the two orthogonal secondary windings of the resolver are respectively mounted on a rotor and a stator of the motor, and a sine resolver feedback signal and a cosine resolver feedback signal are respectively obtained from the two secondary windings through coupling based on an exciting signal applied to the primary winding. The sine resolver feedback signal and the cosine resolver feedback signal may be collectively referred to as a resolver feedback signal. Angular position and rotation speed information of the rotor of the motor may be obtained after the sine resolver feedback signal and the cosine resolver feedback signal are demodulated and converted.

To enable sampling of a resolver electrical angle to reach at least the ASIL C, an existing method is directly inputting a resolver feedback signal that is of an electrical angle and that is output by a resolver into a resolver decoding chip of at least the ASIL C. The resolver decoding chip outputs a resolver exciting signal, obtains a resolver feedback signal to implement angle decoding, and diagnoses input and output signals, to enable an angle signal to reach at least the ASIL C. However, in this solution, although angle sampling of at least the ASIL C can be implemented, material costs of a motor controller are increased because a safety decoding chip of at least the ASIL C is relatively expensive.

SUMMARY

Embodiments of this application provide a motor controller applied to an electric vehicle, a motor angle detection and diagnosis apparatus in the motor controller, and a motor angle detection and diagnosis method, to implement angle decoding of at least an ASIL C without a safety decoding chip, and reduce material costs of the motor controller.

According to a first aspect, an embodiment of this application discloses a motor angle detection and diagnosis apparatus, applied to a motor controller to enable angle sampling to reach at least a function safety goal ASIL C. The motor angle detection and diagnosis apparatus is connected to a drive motor by using a resolver. The resolver is configured to output a resolver feedback signal of an electrical angle of the drive motor. The motor angle detection and diagnosis apparatus includes a signal generation module, a resolver exciting processing circuit, a resolver feedback processing circuit, an angle sampling and diagnosis system, a diagnosis signal sampling circuit, and a first diagnosis module.

The signal generation module is configured to generate an exciting modulation signal, where the exciting modulation signal is generated by comparing an exciting fundamental wave signal with a carrier signal. The resolver exciting processing circuit is connected between the signal generation module and the resolver, and is configured to filter and amplify the exciting modulation signal to obtain an exciting signal, to drive the resolver to work. The resolver feedback processing circuit is connected to the resolver, and is configured to adjust the resolver feedback signal output by the resolver. The angle sampling and diagnosis system is configured to: perform two-channel simultaneous sampling on a resolver feedback signal obtained after the adjustment by the resolver feedback processing circuit, and separately calculate a first electrical angle and a second electrical angle. The first electrical angle is used for torque control and the second electrical angle is used for torque monitoring.

The angle sampling and diagnosis system is further configured to: diagnose data obtained after the two-channel sampling, the first electrical angle, and the second electrical angle in real time, and control the motor controller to enter a safe state when a diagnosis result is abnormal. The diagnosis signal sampling circuit is connected to both the resolver exciting processing circuit and the resolver feedback processing circuit, and is configured to collect the exciting signal and the resolver feedback signal obtained after the adjustment by the resolver feedback processing circuit, to generate a corresponding feedback signal. The first diagnosis module is electrically connected to the diagnosis signal sampling circuit, and is configured to: diagnose an exciting generation loop and a resolver feedback sampling loop based on the feedback signal, and control the motor controller to enter the safe state when diagnosing a fault.

In the technical solution of the first aspect, two-channel simultaneous sampling is performed on the resolver feedback signal obtained after the adjustment by the resolver feedback processing circuit, and the first electrical angle and the second electrical angle are separately calculated; real-time diagnosis is performed in sampling and calculation processes; and the motor controller is controlled to enter the safe state when the diagnosis result is abnormal. In addition, the motor angle detection and diagnosis apparatus further collects the exciting signal and the processed resolver feedback signal to diagnose hardware circuit loops such as the exciting processing circuit and the feedback processing circuit, and controls the motor controller to enter the safe state when a diagnosis result is abnormal, so that the motor angle detection and diagnosis apparatus correspondingly reaches at least ASIL C, to ensure that an entire vehicle or a component can enter a controllable safe state when an electronic system is faulty, thereby ensuring personal safety of a driver, a passenger, and a pedestrian involved in driving.

According to the first aspect, in an embodiment, the angle sampling and diagnosis system includes a first sampling module, a second sampling module, a first calculation module, a second calculation module, and a second diagnosis module. The first sampling module is located at a basic function layer, the second sampling module is located at a monitoring layer, and the first sampling module is the same as the second sampling module. The first sampling module and the second sampling module are respectively configured to sample the resolver feedback signal obtained after the adjustment by the resolver feedback processing circuit, to obtain a first target signal and a second target signal. The first calculation module and the second calculation module are respectively configured to calculate the first electrical angle and the second electrical angle based on the first target signal and the second target signal. The second diagnosis module is configured to diagnose the first target signal and the second target signal in real time, and is further configured to diagnose the first electrical angle and the second electrical angle in real time. In this way, sampling is performed by using two same sampling modules, so that sampling diagnosis coverage can be improved.

According to the first aspect, in an embodiment, to ensure sampling accuracy, the first sampling module includes a first $\Sigma\Delta$ analog to digital converter SD-ADC and a first demodulation module, the second sampling module includes a second SD-ADC and a second demodulation module, and the resolver feedback signal includes a sine feedback signal and a cosine feedback signal. The resolver feedback processing circuit is configured to convert the sine feedback signal into a sine differential signal that matches a level of an SD-ADC port, and is further configured to convert the cosine feedback signal into a cosine differential signal that matches the level of the SD-ADC port. The first SD-ADC is configured to sample the sine differential signal and the cosine differential signal to obtain a first sampled signal. The first demodulation module is configured to demodulate the first sampled signal to separate the exciting signal from the first sampled signal, to obtain the first target signal. The second SD-ADC is configured to sample the sine differential signal and the cosine differential signal to obtain a second sampled signal. The second demodulation module is configured to demodulate the second sampled signal to separate the exciting signal from the second sampled signal, to obtain the second target signal.

According to the first aspect, in an embodiment, the second diagnosis module is further configured to separately read back configuration registers of the first SD-ADC and the second SD-ADC in a preset period, to diagnose whether current configurations of the configuration registers are the same as initial configurations. In this way, a corresponding safety mechanism is added, so that it can be further ensured that angle sampling reaches at least the ASIL C.

According to the first aspect, in an embodiment, to ensure sampling accuracy, the first sampling module includes a first successive approximation register analog to digital converter SAR-ADC, the second sampling module includes a second SAR-ADC, and the resolver feedback signal includes a sine feedback signal and a cosine feedback signal. The resolver feedback processing circuit is configured to convert the sine resolver feedback signal into a sine single-ended signal, and is further configured to convert the cosine feedback signal into a cosine single-ended signal. The first SAR-ADC is configured to sample the sine single-ended signal and the cosine single-ended signal to obtain the first target signal. The second SAR-ADC is configured to sample the sine single-ended signal and the cosine single-ended signal to obtain the second target signal.

According to the first aspect, in an embodiment, the second diagnosis module is further configured to perform a power-on test on the second SAR-ADC, where the power-on test indicates that a preset voltage is injected by using an external port, to determine whether a feedback voltage is the same as the preset voltage. In this way, a corresponding safety mechanism is added, so that it can be further ensured that angle sampling reaches at least the ASIL C.

According to the first aspect, in an embodiment, to improve sampling diagnosis coverage, the second diagnosis module is further configured to separately read back configuration registers of the first SAR-ADC and the second SAR-ADC in a preset period, to diagnose whether current configurations of the configuration registers are the same as initial configurations. In this way, a corresponding safety mechanism is added, so that it can be further ensured that angle sampling reaches at least the ASIL C.

According to the first aspect, in an embodiment, the first target signal includes a first target sine signal and a first target cosine signal, and the second target signal includes a second target sine signal and a second target cosine signal. The second diagnosis module is configured to determine, through real-time comparison, whether the first target sine signal and the second target sine signal fall within a preset noise range, and is further configured to determine, through real-time comparison, whether the first target cosine signal and the second target cosine signal fall within the preset noise range. In this way, sampling branch diagnosis coverage can be improved.

According to the first aspect, in an embodiment, to further improve the sampling branch diagnosis coverage, the second diagnosis module is further configured to check, in real time, whether a sum of a square value of the second target sine signal and a square value of the second target cosine signal falls within a preset value range. In this way, an abnormality caused by a common cause failure can be diagnosed.

According to the first aspect, in an embodiment, the second diagnosis module is further configured to monitor whether a software program stream used to obtain a sampled value is periodically triggered, to further improve the sampling branch diagnosis coverage. This ensures that the sampling module reaches at least the ASIL C.

According to the first aspect, in an embodiment, to improve angle diagnosis coverage, the second diagnosis module is configured to: compare the first electrical angle with the second electrical angle in real time to determine whether a difference between the first electrical angle and the second electrical angle falls within a preset range, and further diagnose calculation processes of the first electrical angle and the second electrical angle, to ensure that the first electrical angle and the second electrical angle reach at least the ASIL C.

According to the first aspect, in an embodiment, the first calculation module and the second calculation module calculate the angles by using different algorithms, to improve angle diagnosis accuracy.

According to the first aspect, in an embodiment, to further diagnose the exciting generation loop and the resolver feedback sampling loop, the feedback signal includes a single-ended signal and a differential signal of the exciting signal; and the first diagnosis module is configured to detect a voltage range of the exciting modulation signal based on the single-ended signal of the exciting signal, and is further configured to detect a frequency and a duty ratio of the exciting modulation signal based on the differential signal of the exciting signal, to diagnose the exciting generation loop. The feedback signal further includes a single-ended signal of the resolver feedback signal; and the first diagnosis module is further configured to diagnose the resolver feedback sampling loop based on the single-ended signal of the resolver feedback signal.

According to a second aspect, an embodiment of this application discloses a motor controller, including an inverter circuit, where an input end of the inverter circuit is connected to a power battery, and an output end of the inverter circuit is connected to a drive motor. The inverter circuit is configured to convert a high-voltage direct current output by the power battery into an alternating current to enable the drive motor to work. The motor controller further includes the motor angle detection and diagnosis apparatus described in any one of the first aspect and the implementations of the first aspect. The motor angle detection and diagnosis apparatus is connected to the drive motor by using a resolver.

According to a third aspect, an embodiment of this application discloses an electric vehicle, including the motor controller described in any one of the second aspect and implementations of the second aspect.

According to a fourth aspect, an embodiment of this application discloses a motor angle detection and diagnosis method, applied to a motor controller to enable angle sampling to reach at least a function safety goal ASIL C. The motor controller is connected to a drive motor by using a resolver. The resolver is configured to output a resolver feedback signal of an angle of the drive motor. The motor angle detection and diagnosis method includes: generating an exciting modulation signal, where the exciting modulation signal is generated by comparing an exciting fundamental wave signal with a carrier signal; filtering and amplifying the exciting modulation signal to obtain an exciting signal, to drive the resolver to work to output the resolver feedback signal; adjusting the resolver feedback signal; performing two-channel simultaneous sampling on an adjusted resolver feedback signal, separately calculating a first electrical angle and a second electrical angle, and diagnosing data obtained after the two-channel sampling, the first electrical angle, and the second electrical angle in real time, where the first electrical angle is used for torque control and the second electrical angle is used for torque monitoring; sampling the exciting signal and the adjusted resolver feedback signal to generate a corresponding feedback signal, and diagnosing an exciting generation loop and a resolver feedback sampling loop based on the feedback signal; and controlling the motor controller to enter a safe state when a diagnosis result is abnormal.

In the technical solution of the fourth aspect, two-channel simultaneous sampling is performed on the adjusted resolver feedback signal, and the first electrical angle and the second electrical angle are separately calculated; real-time diagnosis is performed in sampling and calculation processes; and the motor controller is controlled to enter the safe state when the diagnosis result is abnormal. In addition, in the solution, the exciting signal and the processed resolver feedback signal are further collected to diagnose hardware circuit loops such as the exciting generation loop and the resolver feedback sampling loop, and the motor controller is controlled to enter the safe state when the diagnosis result is abnormal, so that angle sampling reaches corresponding at least ASIL C, to ensure that an entire vehicle or a component can enter a controllable safe state when an electronic system is faulty, thereby ensuring personal safety of a driving participant.

According to the fourth aspect, in an embodiment, the motor controller includes a first sampling module located at a basic function layer and a second sampling module located at a monitoring layer, and the first sampling module is the same as the second sampling module.

The performing two-channel simultaneous sampling on an adjusted resolver feedback signal, separately calculating a first electrical angle and a second electrical angle, and diagnosing data obtained after the two-channel sampling, the first electrical angle, and the second electrical angle in real time includes: respectively sampling, by using the first sampling module and the second sampling module, the resolver feedback signal obtained after the adjustment by the resolver feedback processing circuit, to obtain a first target signal and a second target signal; respectively calculating the first electrical angle and the second electrical angle based on the first target signal and the second target signal; and diagnosing the first target signal and the second target signal in real time, and further diagnosing the first electrical angle and the second electrical angle in real time.

According to the fourth aspect, in an embodiment, the first sampling module includes a first ΣΔ analog to digital converter SD-ADC, the second sampling module includes a second SD-ADC, and the resolver feedback signal includes a sine feedback signal and a cosine feedback signal. The adjusting the resolver feedback signal output by the resolver includes: converting the sine feedback signal into a sine differential signal that matches a level of an SD-ADC port, and further converting the cosine feedback signal into a cosine differential signal that matches the level of the SD-ADC port. The respectively sampling, by using the first sampling module and the second sampling module, the resolver feedback signal obtained after the adjustment by the resolver feedback processing circuit, to obtain a first target signal and a second target signal includes: sampling the sine differential signal and the cosine differential signal by using the first SD-ADC, to obtain a first sampled signal, and sampling the sine differential signal and the cosine differential signal by using the second SD-ADC, to obtain a second sampled signal; and demodulating the first sampled signal to separate the exciting signal from the first sampled signal, to obtain the first target signal, and demodulating the second sampled signal to separate the exciting signal from the second sampled signal, to obtain the second target signal.

According to the fourth aspect, in an embodiment, the motor angle detection and diagnosis method further includes: separately reading back configuration registers of the first SD-ADC and the second SD-ADC in a preset period, to diagnose whether current configurations of the configuration registers are the same as initial configurations.

According to the fourth aspect, in an embodiment, the first sampling module includes a first SAR-ADC, the second sampling module includes a second SAR-ADC, and the resolver feedback signal includes a sine feedback signal and a cosine feedback signal.

The adjusting the resolver feedback signal output by the resolver includes: converting the sine resolver feedback signal into a sine single-ended signal, and converting the cosine feedback signal into a cosine single-ended signal. The respectively sampling, by using the first sampling module and the second sampling module, the resolver feedback signal obtained after the adjustment by the resolver feedback processing circuit, to obtain a first target signal and a second target signal includes: sampling the sine single-ended signal and the cosine single-ended signal by using the first SAR-ADC, to obtain the first target signal, and sampling the sine single-ended signal and the cosine single-ended signal by using the second SAR-ADC, to obtain the second target signal.

According to the fourth aspect, in an embodiment, the motor angle detection and diagnosis method further includes: performing a power-on test on the second SAR-ADC, where the power-on test indicates that a preset voltage is injected by using an external port, to determine whether a feedback voltage is the same as the preset voltage.

According to the fourth aspect, in an embodiment, the motor angle detection and diagnosis method further includes: separately reading back configuration registers of the first SAR-ADC and the second SAR-ADC in a preset period, to diagnose whether current configurations of the configuration registers are the same as initial configurations.

According to the fourth aspect, in an embodiment, the resolver feedback signal includes the sine feedback signal and the cosine feedback signal, the first target signal includes a first target sine signal and a first target cosine signal, and the second target signal includes a second target sine signal and a second target cosine signal. The diagnosing the first target signal and the second target signal in real time includes: determining, through real-time comparison, whether the first target sine signal and the second target sine signal fall within a preset noise range, and further determining, through real-time comparison, whether the first target cosine signal and the second target cosine signal fall within the preset noise range.

According to the fourth aspect, in an embodiment, the diagnosing the first target signal and the second target signal in real time further includes: checking, in real time, whether a sum of a square value of the second target sine signal and a square value of the second target cosine signal falls within a preset value range.

According to the fourth aspect, in an embodiment, the motor angle detection and diagnosis method further includes: monitoring whether a software program stream used to obtain a sampled value is periodically triggered.

According to the fourth aspect, in an embodiment, the diagnosing the first electrical angle and the second electrical angle in real time includes: comparing the first electrical angle with the second electrical angle in real time to determine whether a difference between the first electrical angle and the second electrical angle falls within a preset range, and further diagnosing calculation processes of the first electrical angle and the second electrical angle.

According to the fourth aspect, in an embodiment, the feedback signal includes a single-ended signal and a differential signal of the exciting signal and a single-ended signal of the resolver feedback signal. The diagnosing an exciting generation loop and a resolver feedback sampling loop based on the feedback signal includes: detecting a voltage range of the exciting modulation signal based on the single-ended signal of the exciting signal, and further detecting a frequency and a duty ratio of the exciting modulation signal based on the differential signal of the exciting signal, to diagnose the exciting generation loop; and diagnosing the resolver feedback sampling loop based on the single-ended signal of the resolver feedback signal.

BRIEF DESCRIPTION OF DRAWINGS

To describe the technical solutions in the embodiments of this application or in the background more clearly, the following briefly describes the accompanying drawings needed for describing the embodiments of this application or the background.

DESCRIPTION OF EMBODIMENTS

Embodiments of this application provide an electric vehicle, a motor controller applied to the electric vehicle, a motor angle detection and diagnosis apparatus in the motor controller, and a motor angle detection and diagnosis method, to implement angle decoding of at least an ASIL C without a safety decoding chip, and reduce material costs of the motor controller.

The electric vehicle includes a battery electric vehicle (BEV), a hybrid electric vehicle (HEV), and a plug-in hybrid electric vehicle (PHEV).

The battery electric vehicle includes a motor. An energy source of the motor is a power battery. The power battery of the battery electric vehicle can be recharged from an external power grid. The power battery of the battery electric vehicle is actually a unique source of in-vehicle energy for vehicle propulsion.

The hybrid electric vehicle includes an internal combustion engine and a motor. An energy source of the engine is fuel, and an energy source of the motor is a power battery.

The engine is a main source of energy for vehicle propulsion, and the power battery of the hybrid electric vehicle provides supplementary energy for vehicle propulsion (the power battery of the hybrid electric vehicle electrically buffers fuel energy and recovers kinetic energy).

The plug-in hybrid electric vehicle differs from the hybrid electric vehicle in that a power battery of the plug-in hybrid electric vehicle has a larger capacity than the power battery of the hybrid electric vehicle, and the power battery of the plug-in hybrid electric vehicle can be recharged from a power grid. The power battery of the plug-in hybrid electric vehicle is a main source of energy for vehicle propulsion until a loss of the power battery of the plug-in hybrid electric vehicle reaches a low energy level. In this case, the plug-in hybrid electric vehicle operates as the hybrid electric vehicle for vehicle propulsion.

The following describes the embodiments of this application with reference to accompanying drawings. In the embodiments of this application, a structure of an electric vehicle is described by using a battery electric vehicle as an example.

Figure 1:
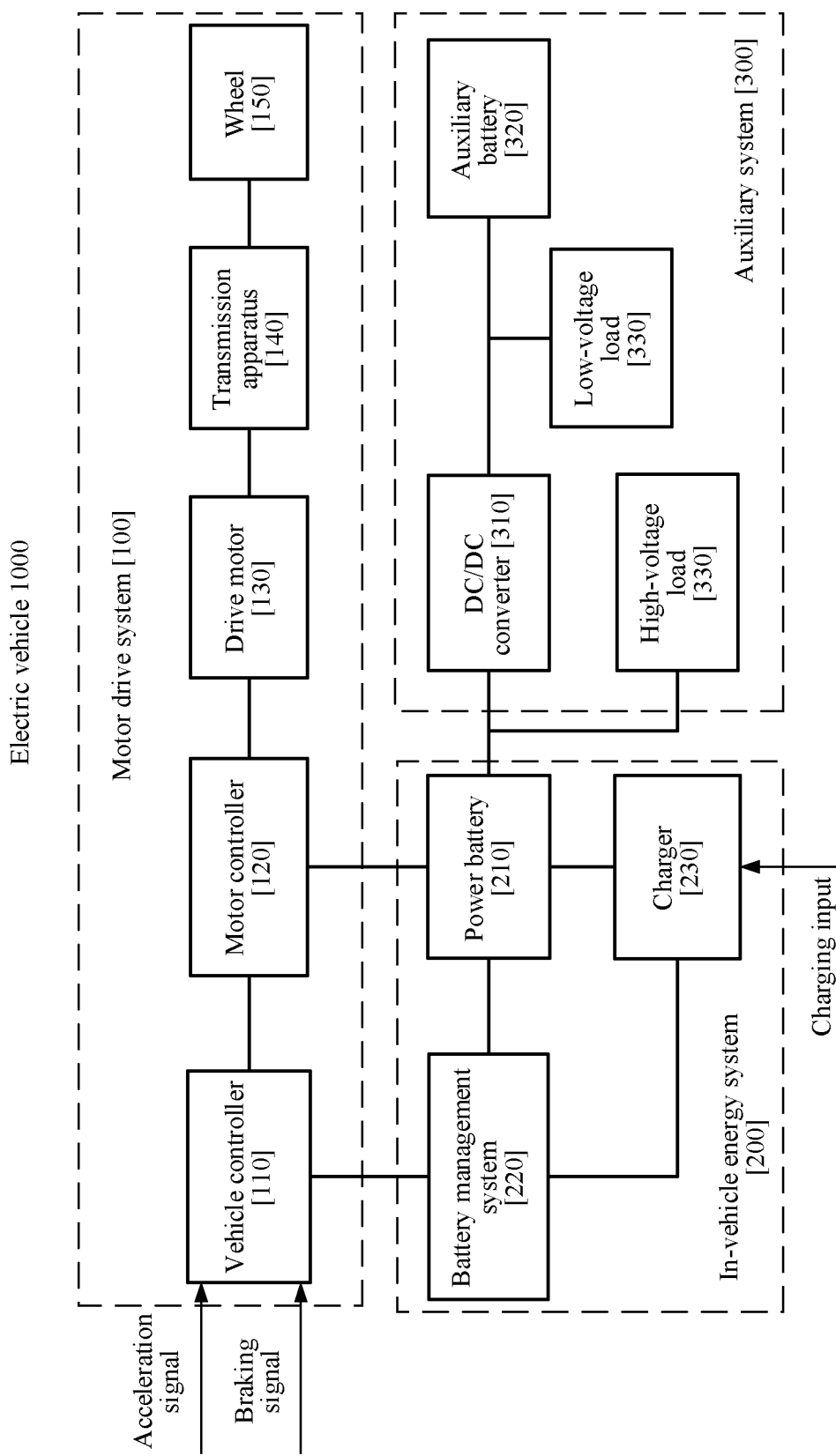
FIG. 1 is a diagram of an electric vehicle in an embodiment of this application.

As shown in FIG. 1, an electric vehicle 1000 includes a motor drive system 100 configured to drive the vehicle to travel, an in-vehicle energy system 200 configured to provide energy, and an auxiliary system 300. The motor drive system 100 includes a vehicle controller 110, a motor controller 120, a drive motor 130, a transmission apparatus 140, and a wheel 150. The in-vehicle energy system 200 includes a power battery 210, a battery management system 220, and a charger 230.

The vehicle controller (VCU) 110 is also referred to as a power assembly controller, is a core control component of the entire vehicle, and is equivalent to a brain of the vehicle. After collecting an accelerator pedal signal, a brake pedal signal, and other component signals and making corresponding determining, the vehicle controller 110 controls actions of lower-layer component controllers, to drive the vehicle to normally travel. As a command and management center of the vehicle, main functions of the vehicle controller include drive torque control, brake energy optimization control, vehicle energy management, controller area network (CAN) maintenance and management, fault diagnosis and processing, vehicle status monitoring, and the like. The vehicle controller controls operation of the vehicle. Therefore, performance of the vehicle controller directly determines stability and safety of the vehicle.

The motor controller 120 is an integrated circuit that actively works to control the drive motor 130 to work based on a specified direction, speed, angle, and response time, and is communicatively connected to the vehicle controller 130. In the electric vehicle 1000, the motor controller 120 is configured to convert, based on an instruction of a gear, a throttle, a brake, or the like, electric energy stored in the power battery 210 into electric energy needed for the drive motor 130, to control a traveling state such as startup and operation, a forward/backward speed, or a climbing force of the electric vehicle 1000, or help the electric vehicle 1000 brake and store some brake energy in the power battery 210.

The drive motor 130 (commonly referred to as a "motor") is an electromagnetic apparatus that implements electric energy conversion or transmission according to the law of electromagnetic induction, and is electrically connected to the motor controller 120 and mechanically connected to the transmission apparatus 140. The drive motor 130 is mainly configured to generate drive torque as a power source of the wheel 150. In some embodiments, the drive motor 130 may further convert mechanical energy into electric energy; in other words, may be further used as a generator.

The drive motor 130 may be a permanent-magnet synchronous motor (PMSM)-type motor. The drive motor 130 may include a stator and a rotor. The stator includes a stator winding. The rotor may rotate about a central axis relative to the stator. The drive motor 130 may be controlled by enabling a common sine current to flow through the stator winding. An amplitude and a frequency of the current can be changed to control torque and a rotation speed of the rotor. The stator current generates an electromagnetic field, and the electromagnetic field interacts with a permanent magnet used as a component of the rotor. The electromagnetic field enables the rotor to rotate.

For example, the drive motor 130 may be a three-phase motor. In other words, the stator winding may include three separate phase windings. To control the drive motor 130, a three-phase voltage wave or a three-phase current wave is applied to the phase windings. The three-phase wave enables signals of all phases to be separated from each other based on a phase difference of 120 degrees.

The transmission apparatus 140 is further mechanically connected to the wheel 150, and is configured to transmit the power source generated by the drive motor 130 to the wheel 150, to drive the electric vehicle 1000 to travel. In some implementations, the transmission apparatus 140 may include a drive shaft (not shown) connected between two wheels 150 and a differential (not shown) disposed on the drive shaft.

The power battery 210 is electrically connected to the motor controller 120, and is configured to store and provide electric energy. The power battery 210 includes but is not limited to a lead-acid battery, a lithium iron phosphate battery, a nickel-hydrogen battery, a nickel-cadmium battery, and the like. In some embodiments, the power battery 210 may alternatively include a supercapacitor.

The battery management system 220 is electrically connected to the power battery 210, and is communicatively connected to the vehicle controller 110. The battery management system 220 is configured to monitor and estimate states of the power battery 210 in different working conditions, to improve utilization of the power battery 210, and prevent the power battery 210 from being overcharged or over-discharged, thereby prolonging a lifespan of the power battery 210. Main functions of the battery management system 220 may include real-time battery physical parameter monitoring, battery status estimation, online diagnosis and warning, charging, discharging, and pre-charging control, balancing management and heat management, and the like.

The charger 230 is electrically connected to the power battery 210, and is configured to be connected to an external power supply to charge the power battery 210. When the electric vehicle 1000 is connected to an external power supply (such as a charging pile), the charger 230 converts an alternating current provided by the external power supply into a direct current, to charge the power battery 219. In addition, the battery management system 220 is further connected to the charger 230 to monitor a charging process of the power battery 210.

The auxiliary system 300 includes a DC/DC converter 310, an auxiliary battery 320, a low-voltage load 330, and a high-voltage load 340. One end of the DC/DC converter 310 is connected to the power battery 210, and the other end of the DC/DC converter 310 is connected to both the auxiliary battery 320 and the low-voltage load 330. The DC/DC converter 310 is configured to: after converting a high voltage (such as 380 V) output by the power battery 210 into a low voltage (such as 12 V), charge the auxiliary battery 320 and supply power to the low-voltage load 330. In some implementations, the low-voltage load 330 includes low-voltage vehicle accessories such as a cooling pump, a fan, a heater, a power steering apparatus, and a brake. Certainly, the auxiliary battery 320 may also supply power to the low-voltage load 330. In addition, the power battery 210 is further connected to the high-voltage load 340 to supply power to the high-voltage load 340. In some implementations, the high-voltage load 340 includes a PTC heater, an air conditioning unit, and the like.

It should be noted that electronic modules in the electric vehicle 1000 may communicate with each other by using one or more vehicle networks. The vehicle network may include a plurality of channels for communication. A channel of the vehicle network may be, for example, a serial bus of a controller area network (CAN). One of the channels of the vehicle network may include Ethernet defined by the Institute of Electrical and Electronics Engineers (IEEE) 802 standard family. Other channels of the vehicle network may include a discrete connection between modules and may include a power signal from the auxiliary battery 130. Different signals may be transmitted by using different channels of the vehicle network. For example, a video signal may be transmitted by using a high-speed channel (such as Ethernet), and a control signal may be transmitted by using a CAN or a discrete signal. The vehicle network may include any hardware component and software component assisting in signal and data transmission between modules. The vehicle network is not shown in FIG. 1, but it may be implied that the vehicle network may be connected to any electronic module in the electric vehicle 1000. For example, the vehicle network may exist in the vehicle controller 110 to coordinate operations of the components.

It may be understood that the structure in this embodiment of this application constitutes no limitation on the electric vehicle 1000. In some other embodiments of this application, the electric vehicle 1000 may include more or fewer components than those shown in the figure, combine some components, split some components, or have different component arrangements. The component shown in the figure may be implemented by using hardware, software, or a combination of software and hardware.

As a core power component of the electric vehicle 1000, function safety of the motor controller 120 is particularly important. The international standard ISO 26262 Road Vehicle Function Safety determines a safety requirement level (Automotive Safety Integrity Level, vehicle safety integrity level ASIL) for a system or a component of the system based on a safety risk degree, where safety requirement levels vary from A to D. A higher ASIL level indicates higher diagnosis coverage of a circuit related to function safety and a lower corresponding hardware random failure probability metric. This standard provides how to comply with a corresponding specification from a design perspective to enable a product to reach a corresponding ASIL level, to ensure that an entire vehicle or a component can enter a controllable safe state when an electronic system is faulty, thereby ensuring personal safety of a driving participant.

Torque safety is a most important function safety goal of the motor controller 120, and is generally defined as no unexpected torque acceleration or deceleration, or unexpected startup. A highest torque function safety goal ASIL (Automotive Safety Integration Level, automotive safety integrity level) of the motor controller 120 reaches at least an ASIL C or an ASIL D.

There are two methods for torque safety estimation: a power method and a magnetic chain method. In the magnetic chain method, few physical quantities need to be sampled while high accuracy is achieved, and input quantities needed for use of the magnetic chain method are a three-phase current and an electrical angle of a motor. That is, to enable a torque safety goal level to reach at least the ASIL C, an electrical angle of a motor needs to reach at least the ASIL C, where the electrical angle of the motor is one of input quantities that need to be used to calculate torque. Whether the electrical angle of the motor can reach at least the ASIL C depends on sampling and diagnosing on the electrical angle.

The following describes in detail a structure and a corresponding function of the motor controller 120 in this embodiment of this application. Torque function safety of the motor controller 120 in this embodiment of this application meets at least the ASIL C.

Figure 2:
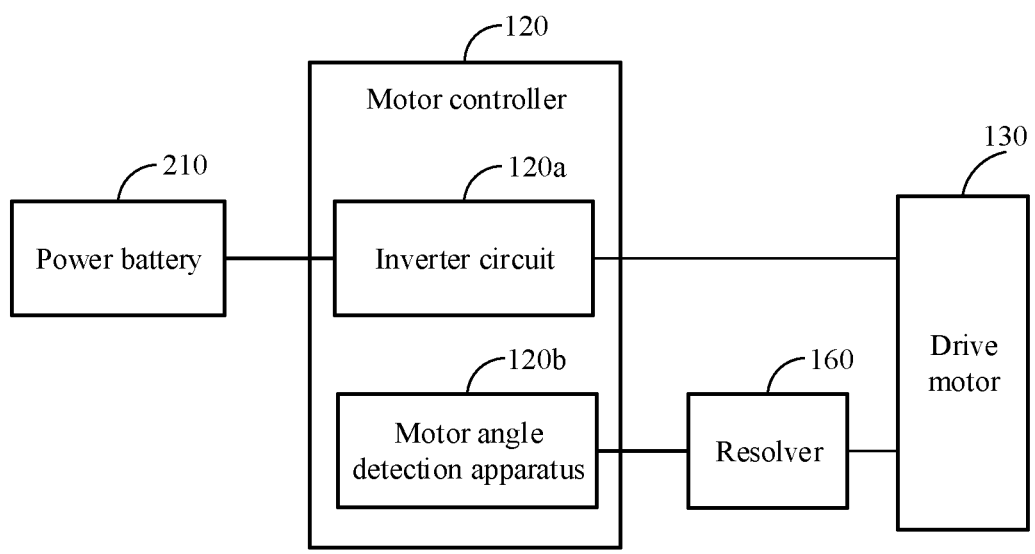
FIG. 2 is an application diagram of a motor controller in FIG. 1.

As shown in FIG. 2, the motor controller 120 includes an inverter circuit 120a and a motor angle detection and diagnosis apparatus 120b. An input end of the inverter circuit 120a is connected to the power battery 210, and an output end of the inverter circuit 120a is connected to the drive motor 130. The inverter circuit 120a is configured to convert a high-voltage direct current output by the power battery 210 into an alternating current (such as a three-phase alternating current), to enable the drive motor 130 to work.

The motor angle detection and diagnosis apparatus 120b is connected to the drive motor 130 by using a resolver (resolver/transformer) 160, to decode a resolver feedback signal output by the resolver 160, to obtain an electrical angle of the drive motor 130. The resolver 160 is a sensor that accurately measures an angular position and speed of a rotation component such as a motor through a magnetic coupling effect between a primary winding and two secondary windings. The primary winding and the two orthogonal secondary windings of the resolver 160 are respectively mounted on a rotor and a stator of the motor, and a sine resolver feedback signal and a cosine resolver feedback signal are respectively obtained from the two secondary windings through coupling based on an exciting signal applied to the primary winding. The sine resolver feedback signal and the cosine resolver feedback signal may be collectively referred to as a resolver feedback signal. Angular position and rotation speed information of the rotor of the motor may be obtained after the sine resolver feedback signal and the cosine resolver feedback signal are demodulated and converted.

It may be understood that the structure in this embodiment of this application constitutes no limitation on the motor controller 120. In other embodiments of this application, the motor controller 120 may include more components than those shown in the figure, such as an auxiliary power supply circuit, a charging circuit, and a voltage/current detection circuit.

Figure 3:
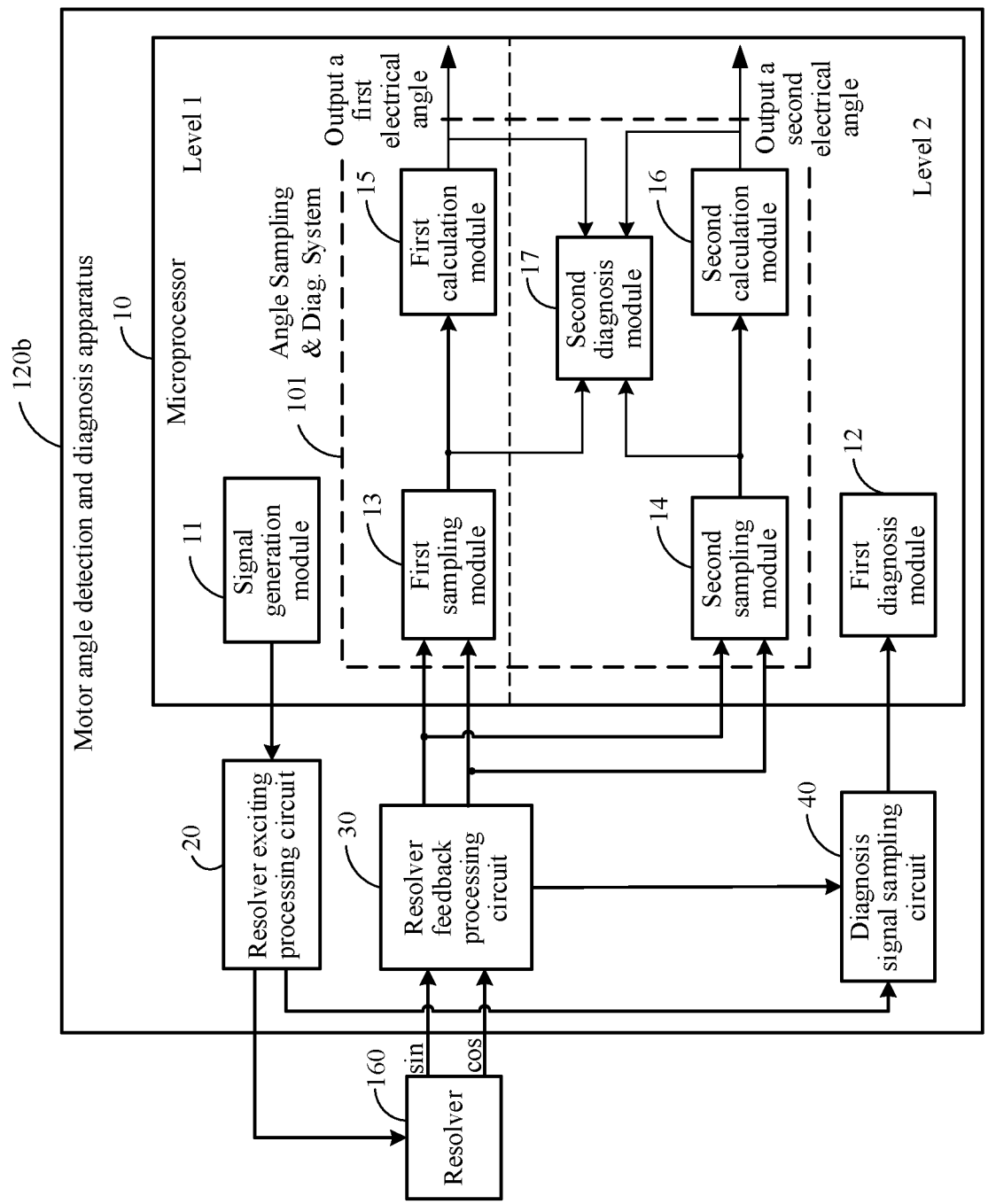
FIG. 3 is a diagram of a motor angle detection and diagnosis apparatus in an embodiment of this application.

FIG. 3 is a diagram of a motor angle detection and diagnosis apparatus in an embodiment of this application. As shown in FIG. 3, a motor angle detection and diagnosis apparatus 120b includes a microprocessor 10, a resolver exciting processing circuit 20, a resolver feedback processing circuit 30, and a diagnosis signal sampling circuit 40. The microprocessor 10 includes a signal generation module 11, an angle sampling and diagnosis system 101, and a first diagnosis module 12.

The signal generation module 11 is configured to generate an exciting modulation signal. In some implementations, the signal generation module 11 is configured to: generate an exciting fundamental wave signal and a carrier signal, and generate the exciting modulation signal after comparing the exciting fundamental wave signal with the carrier signal. In the implementations, the exciting fundamental wave signal is a sine wave signal, and may be obtained through table lookup. The carrier signal is a symmetrical triangular wave signal, and may be implemented by using a counter. Therefore, the exciting modulation signal in this embodiment of this application is a high-frequency PWM (pulse width modulation) signal that includes an exciting fundamental wave component.

The resolver exciting processing circuit 20 is connected between the microprocessor 10 and an input end of a resolver 160, and is configured to obtain an exciting signal after filtering and amplifying the exciting modulation signal, to drive the resolver 160 to work to enable the resolver 160 to output a resolver feedback signal of an electrical angle of a drive motor 130. The resolver feedback signal includes a sine feedback signal and a cosine feedback signal. The exciting signal is a sine wave signal.

The resolver feedback processing circuit 30 is connected between an output end of the resolver 160 and the microprocessor 10, and is configured to: adjust the resolver feedback signal, and send an adjusted resolver feedback signal to the microprocessor 10.

The angle sampling and diagnosis system 101 is configured to: perform two-channel simultaneous sampling on the resolver feedback signal obtained after the adjustment by the resolver feedback processing circuit 30, and separately calculate a first electrical angle and a second electrical angle. The first electrical angle is used for torque control and the second electrical angle is used for torque monitoring. The angle sampling and diagnosis system 101 is further configured to: diagnose data obtained after the two-channel sampling, the first electrical angle, and the second electrical angle in real time, and control a motor controller 120 to enter a safe state when a diagnosis result is abnormal.

The safe state indicates that drive output is shut down and the motor controller 120 enters an active short-circuit state or a natural bridge arm shutdown state. That is, an inverter circuit 120a of the motor controller 120 stops outputting electric energy to the drive motor 130, to ensure that an entire vehicle or a component can enter a controllable safe state when an electronic system is faulty, thereby ensuring personal safety of a driving participant.

The diagnosis signal sampling circuit 40 is electrically connected to both the resolver exciting processing circuit 20 and the resolver feedback processing circuit 30, and is configured to collect the exciting signal and the resolver feedback signal obtained after the processing by the resolver feedback processing circuit 30, and generate a corresponding feedback signal. The first diagnosis module 12 is connected to the diagnosis signal sampling circuit 40, and is configured to: diagnose, based on the feedback signal, whether the exciting processing circuit 20 and the feedback processing circuit 30 are faulty, and control the motor controller 120 to enter the safe state when diagnosing a fault.

In this implementation, the feedback signal includes a single-ended signal and a differential signal of the exciting signal. The first diagnosis module 12 detects, based on the single-ended signal of the exciting signal, whether a voltage range (an amplitude) of the exciting modulation signal is normal, and further detects, based on the differential signal of the exciting signal, whether a frequency and a duty ratio of the exciting modulation signal are normal, to diagnose an exciting generation loop. In addition, the feedback signal further includes a single-ended signal of the resolver feedback signal; and the first diagnosis module 12 further diagnoses a resolver feedback sampling loop based on the single-ended signal of the resolver feedback signal. The exciting generation loop includes the signal generation module 11 and the resolver exciting processing circuit 20. The resolver feedback sampling loop includes the resolver feedback processing circuit 30.

The motor angle detection and diagnosis apparatus 120b disclosed in this embodiment of this application performs two-channel simultaneous sampling on the resolver feedback signal obtained after the adjustment by the resolver feedback processing circuit 30, and separately calculates the first electrical angle and the second electrical angle; performs real-time diagnosis in sampling and calculation processes; and controls the motor controller 120 to enter the safe state when the diagnosis result is abnormal. In addition, the motor angle detection and diagnosis apparatus 120b further collects the exciting signal and the processed resolver feedback signal to diagnose hardware circuit loops such as the exciting processing circuit 20 and the feedback processing circuit 30, and controls the motor controller 120 to enter the safe state when a diagnosis result is abnormal, so that the motor angle detection and diagnosis apparatus 120b reaches corresponding at least ASIL C, to ensure that an entire vehicle or a component can enter a controllable safe state when an electronic system is faulty, thereby ensuring personal safety of a driving participant.

In other words, the angle detection and diagnosis apparatus 120b in this embodiment of this application performs sampling by using two sampling channels, implements angle software decoding by using a software algorithm, and adds a software diagnosis mechanism on this basis, so that angle decoding of at least the ASIL C can be implemented. In this solution, use of a safety decoding chip in the prior art is avoided, and reduce production costs of a corresponding product.

The angle sampling and diagnosis system 101 includes a first sampling module 13, a second sampling module 14, a first calculation module 15, a second calculation module 16, and a second diagnosis module 17. The first sampling module 13 is the same as the second sampling module 14.

The first sampling module 13 is configured to sample the resolver feedback signal obtained after the adjustment by the resolver feedback processing circuit 30, to obtain a first target signal, and the second sampling module 14 is configured to sample the resolver feedback signal obtained after the adjustment by the resolver feedback processing circuit 30, to obtain a second target signal. The first target signal includes a first target sine signal and a first target cosine signal, and the second target signal includes a second target sine signal and a second target cosine signal.

The first calculation module 15 is configured to calculate the first electrical angle based on the first target signal, and the second calculation module 16 is configured to calculate the second electrical angle based on the second target signal.

The second diagnosis module 17 is configured to perform fault diagnosis on the first target signal and the second target signal in real time, and is further configured to diagnose the first electrical angle and the second electrical angle in real time.

It may be understood that, to use an existing design as much as possible to increase a quantity of reuse times, a system of the motor controller 120 usually uses an EGAS three-layer architecture. A main design concept of the EGAS architecture of the motor controller is hierarchically designing a control system; in other words, dividing the control system into a basic function layer (Level 1), a function monitoring layer (Level 2), and a processor monitoring layer (Level 3). The basic function layer (Level 1) mainly implements a basic function of the control system, that is, outputs torque for the motor controller 120. The function monitoring layer (Level 2) mainly monitors the level 1, and includes a component monitoring function, an input/output variable diagnosis function, and a function of performing a system fault response after detecting a fault, for example, monitors an actual output value obtain after torque calculation to determine whether level 1 software is correct. Once a fault is diagnosed, a system fault response is triggered and executed by the level 2. The processor monitoring layer (Level 3) mainly monitors, through question and answer, whether a processor of the level 2 is faulty, and needs to be implemented by an independent application-specific integrated circuit ASIC or microprocessor. After a fault occurs, a system fault response is triggered and executed independently of the level 1.

Therefore, in this embodiment of this application, to use an existing design as much as possible to increase a quantity of reuse times, the signal generation module 11, the first sampling module 13, and the first calculation module 15 are distributed at the basic function layer. The first diagnosis module 12, the second sampling module 14, the second calculation module 16, and the second diagnosis module 17 are distributed at the function monitoring layer. The second sampling module 14 is configured to monitor and diagnose the first sampling module 13, thereby improving diagnosis coverage.

As an implementation, the second diagnosis module 17 is configured to determine, through real-time comparison, whether the first target sine signal and the second target sine signal fall within a preset noise range, and is further configured to determine, through real-time comparison, whether the first target cosine signal and the second target cosine signal fall within the preset noise range. The preset noise range is a noise range of an ADC. For example, 4 to 5 least significant bits may be considered. When a comparison result exceeds the preset noise range, it is determined that a sampling channel is abnormal, and the motor controller 120 is controlled to enter the safe state. In this way, sampling branch diagnosis coverage can be improved.

In some implementations, to further improve the sampling branch diagnosis coverage, the second diagnosis module 17 is further configured to check, in real time, whether a sum of a square value of the second target sine signal and a square value of the second target cosine signal falls within a preset value range. The preset value range is from 0.65 to 1.35 (namely, 1±35%), is not limited, and may be set based on an actual case.

It should be noted that, although isomorphic modules are used in sampling channels for two-channel comparison, at least 99% of common cause failures can be covered because an input signal is a dynamic variable and can be covered at a full scale, and a safety mechanism is sufficient, for example, $SIN^2(\theta)+COS^2(\theta)=1$.

In addition, in some implementations, the second diagnosis module 17 is further configured to monitor whether a software program stream used to obtain a sampled value is periodically triggered, to further improve the sampling branch diagnosis coverage. This ensures that the sampling module reaches at least the ASIL C.

Similarly, to improve calculation module diagnosis coverage, in some implementations, the second diagnosis module 17 is further configured to: compare the first electrical angle with the second electrical angle in real time to determine whether a difference between the first electrical angle and the second electrical angle falls within a preset range, and further diagnose calculation processes of the first electrical angle and the second electrical angle.

In addition, in some implementations, the first calculation module 15 and the second calculation module 16 may further calculate the angles by using different algorithms, to improve angle diagnosis accuracy. Certainly, in other implementations, the first calculation module 15 and the second calculation module 16 may alternatively calculate the angles by using a same algorithm. This is not limited herein.

Figure 4:
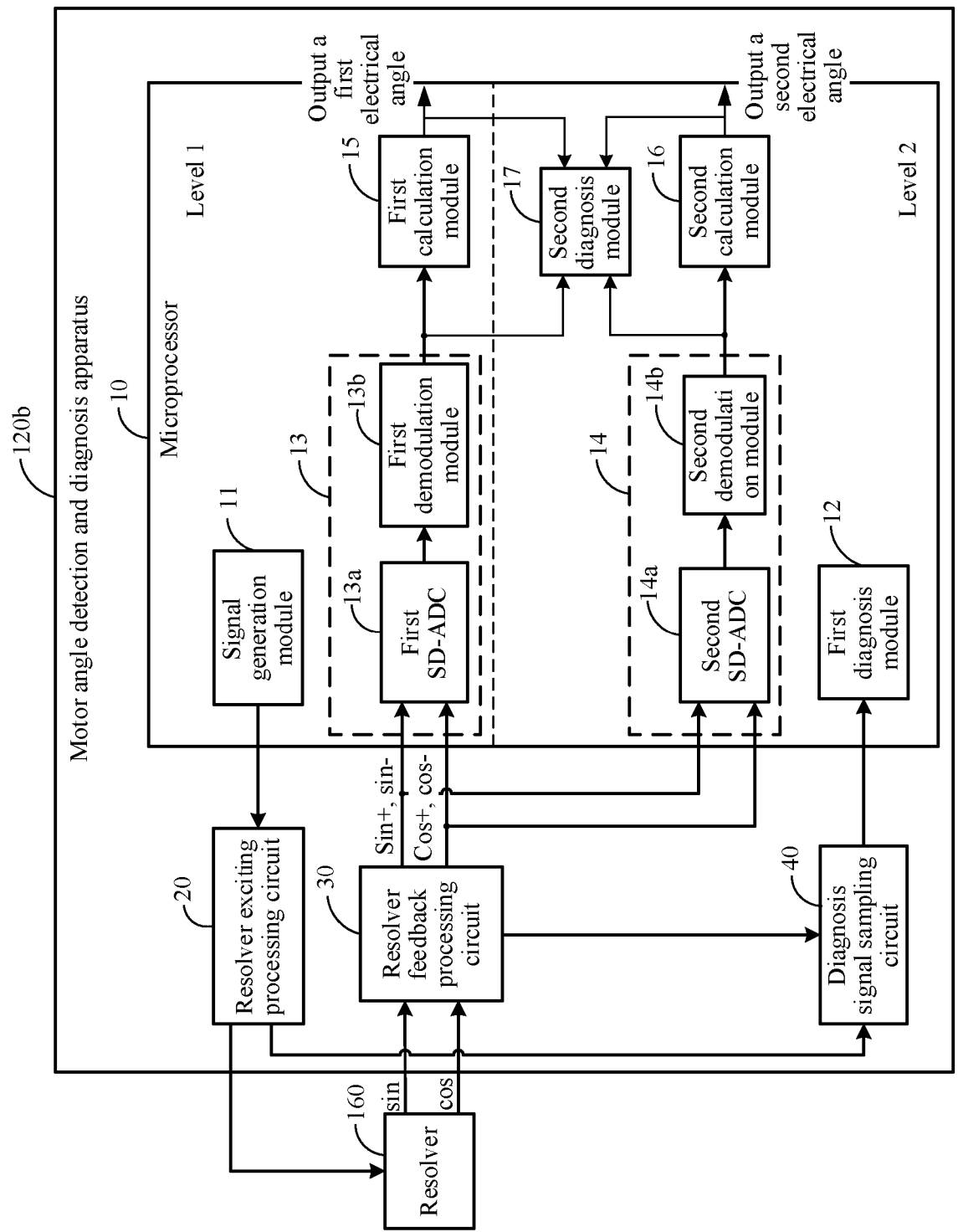
FIG. 4 is a diagram of a motor angle detection and diagnosis apparatus in another embodiment of this application.

FIG. 4 is a diagram of a motor angle detection and diagnosis apparatus in another embodiment of this application. As shown in FIG. 4, in this embodiment of this application, the first sampling module 13 includes a first ΣΔ analog to digital converter (Sigma Delta Analog to Digital Converter, SD-ADC) 13*a* and a first demodulation module 13*b*. The second sampling module 14 includes a second SD-ADC 14*a* and a second demodulation module 14*b*. A clock of the first SD-ADC 13*a* is synchronized with a clock of the second SD-ADC 14*a*, to ensure that the two-channel sampling is simultaneously performed.

In this implementation, the resolver feedback processing circuit 30 is configured to convert the sine feedback signal into a sine differential signal that matches a level of an SD-ADC port, and is further configured to convert the cosine feedback signal into a cosine differential signal that matches the level of the SD-ADC port.

The first SD-ADC 13*a* is configured to sample the sine differential signal and the cosine differential signal to obtain a first sampled signal. The first demodulation module 13*b* is configured to demodulate the first sampled signal to separate the exciting signal from the first sampled signal, to obtain the first target signal.

The second SD-ADC 14*a* is configured to sample the sine differential signal and the cosine differential signal to obtain a second sampled signal. The second demodulation module 14*b* is configured to demodulate the second sampled signal to separate the exciting signal from the second sampled signal, to obtain the second target signal.

It should be noted that the exciting signal of the resolver 160 is a high-frequency sine signal, and it may be learned from a working principle of the resolver, that sine and cosine signals sensed from two stator windings include the high-frequency signal. Although a high-resolution digital signal is obtained after an analog signal output by the resolver passes through an SD-ADC and then further extracted and filtered, the digital signal still includes a carrier signal. Therefore, to obtain sine and cosine target signals directly related to an angle, the carrier signal needs to be demodulated from the digital signal by using a demodulation module.

To improve diagnosis coverage of a sampling decoding branch of the SD-ADC, more safety mechanisms need to be added, to enable corresponding sampling to reach at least the ASIL C. Therefore, in some implementations, before the first SD-ADC 13*a* and the second SD-ADC 14*a* perform sampling, the second diagnosis module 17 is further configured to: separately read back configuration registers of the first SD-ADC 13*a* and the second SD-ADC 14*a* in a preset period, to diagnose whether current configurations of the configuration registers are the same as initial configurations; and if the current configurations of the configuration registers are different from the initial configurations, determine that a diagnosis result is abnormal, and control the motor controller 120 to enter the safe state.

Figure 5:
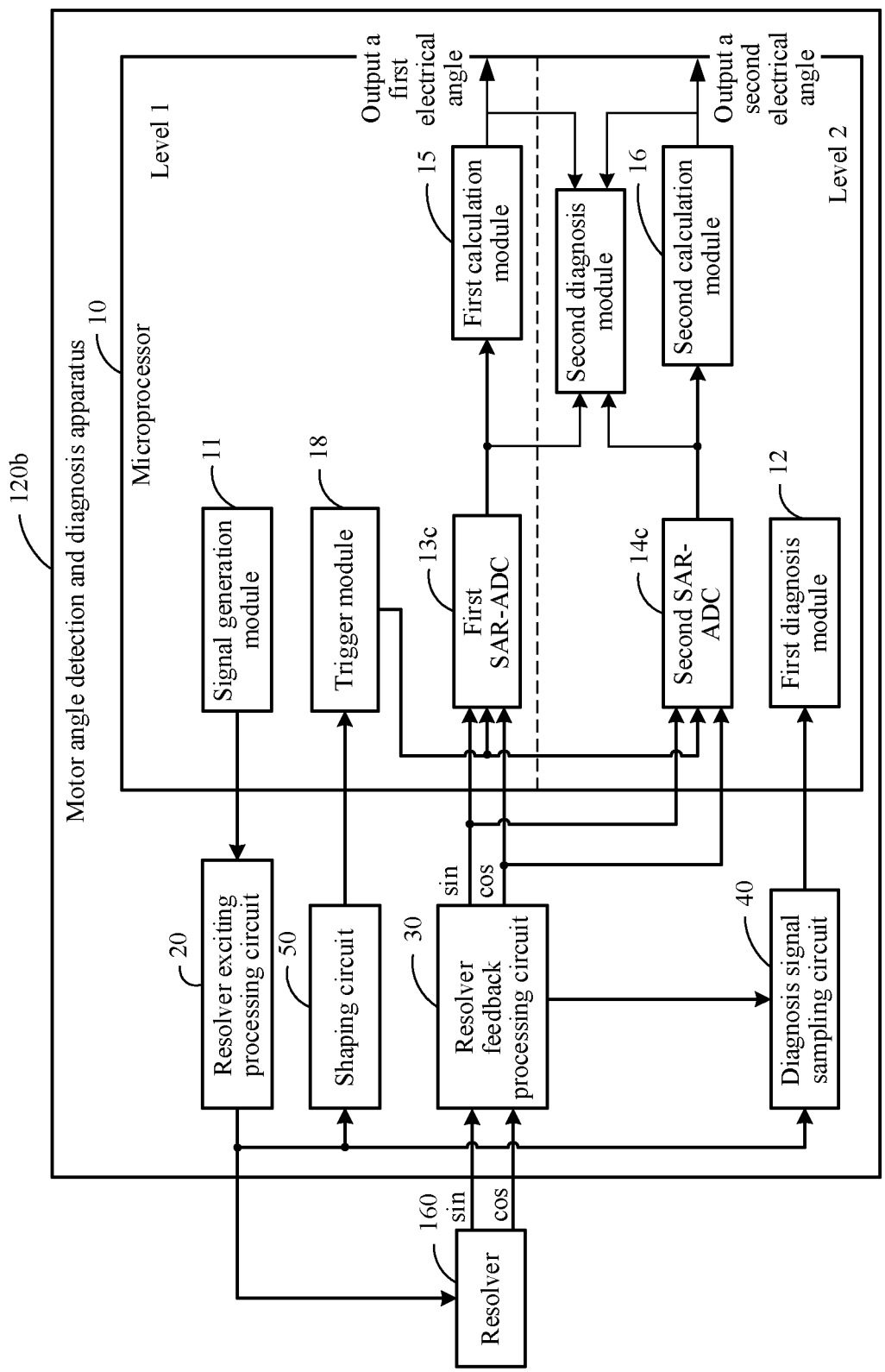
FIG. 5 is a diagram of a motor angle detection and diagnosis apparatus in still another embodiment of this application.

FIG. 5 is a diagram of a motor angle detection and diagnosis apparatus in still another embodiment of this application. In this implementation, the first sampling module 13 includes a first successive approximation register analog to digital converter (Successive Approximation Register ADC, SAR-ADC) 13c. The second sampling module 14 includes a second SAR-ADC 14c. The SAR-ADC has relatively high sampling accuracy and further has features such as ease of use and low power consumption, which can reduce system power consumption while facilitating integration.

In this implementation, the resolver feedback processing circuit 30 is configured to convert the sine resolver feedback signal into a sine single-ended signal, and is further configured to convert the cosine feedback signal into a cosine single-ended signal.

The first SAR-ADC 13c is configured to sample the sine single-ended signal and the cosine single-ended signal to obtain the first target signal. The second SAR-ADC 14c is configured to sample the sine single-ended signal and the cosine single-ended signal to obtain the second target signal.

To improve diagnosis coverage of a sampling branch of the SAR-ADC, more safety mechanisms need to be added, to enable corresponding sampling to reach at least the ASIL C. Therefore, in some implementations, before the first SAR-ADC 13c and the second SD-ADC 14c perform sampling, the second diagnosis module 17 is further configured to perform a power-on test on the second SAR-ADC. The power-on test indicates that a preset voltage is injected by using an external port, to determine whether a feedback voltage is the same as the preset voltage. If the feedback voltage is different from the preset voltage, it is determined that a diagnosis result is abnormal, and the motor controller 120 is controlled to enter the safe state.

In addition, the second diagnosis module 17 is further configured to separately read back configuration registers of the first SAR-ADC 13c and the second SAR-ADC 14c in a preset period, to diagnose whether current configurations of the configuration registers are the same as initial configurations. If the current configurations of the configuration registers are different from the initial configurations, it is determined that a diagnosis result is abnormal, and the motor controller 120 is controlled to enter the safe state. In this way, the sampling branch diagnosis coverage can be further improved.

It should be noted that a basic converter architecture of the SAR-ADC samples an input signal once on each conversion starting edge, performs bit comparison on each clock edge, and adjusts output of the digital-to-analog converter by using control logic until the output very closely matches analog input. Therefore, the basic converter architecture needs N clock cycles from an independent external clock to iteratively implement single N-bit conversion. Therefore, in this implementation, to ensure sampling and diagnosis accuracy, the SAR-ADC 13c and the second SAR-ADC 14c need to be synchronously triggered.

In some implementations, to trigger the SAR-ADC, the motor angle detection and diagnosis apparatus 120b further includes a shaping circuit 50. The microprocessor 10 further includes a trigger module 18. The shaping circuit 50 is connected between the resolver exciting processing circuit 20 and the trigger module 18, and is configured to shape the exciting signal to obtain a square wave signal. When capturing a rising edge of the square wave signal, the trigger module 18 resets a synchronization counter, and obtains a trigger signal by using the counter, to trigger sampling of the SAR-ADC. After the sampling is completed, interruption is entered, to obtain a sampled value for angle calculation. A trigger latency of the counter may be set to a reasonable value based on a circuit latency, to dodge a zero crossing point of the exciting signal; in other words, to ensure, as far as possible, that sampling is performed near a peak point of the exciting fundamental wave signal. This avoids a relatively large calculation error generated because a divisor is close to 0, and improves sampling accuracy.

It may be understood that, in another embodiment, the shaping circuit 50 may be alternatively omitted provided that the exciting signal is sent to the diagnosis signal sampling circuit 40, and the diagnosis signal sampling circuit 40 shapes the exciting signal and then sends a shaped exciting signal to the trigger module 18.

Figure 6:
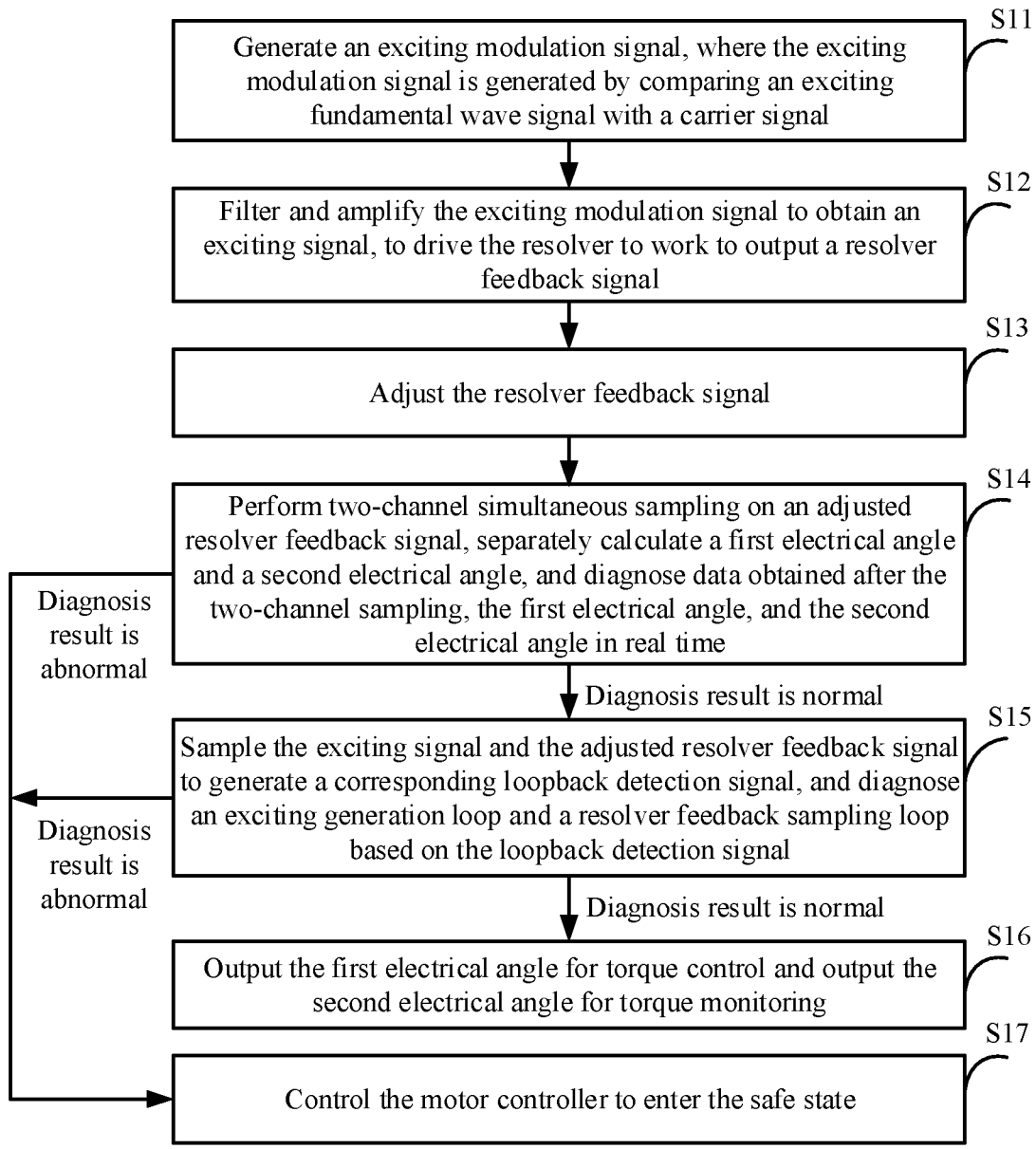
FIG. 6 is a flowchart of a motor angle detection and diagnosis method in an embodiment of this application.

FIG. 6 is a flowchart of a motor angle detection and diagnosis method in an embodiment of this application. The motor angle detection and diagnosis method is applied to the motor angle detection and diagnosis apparatus 120b in FIG. 3 to FIG. 5. The motor angle detection and diagnosis method includes the following steps:

Step S11: Generate an exciting modulation signal, where the exciting modulation signal is generated by comparing an exciting fundamental wave signal with a carrier signal.

In this implementation, the exciting fundamental wave signal is a sine wave signal, and may be obtained through table lookup. The carrier signal is a symmetrical triangular wave signal, and may be implemented by using a counter. Therefore, the exciting modulation signal in this embodiment of this application is a high-frequency PWM (pulse width modulation) signal that includes an exciting fundamental wave component.

Step S12: Filter and amplify the exciting modulation signal to obtain an exciting signal, to drive the resolver to work to output the resolver feedback signal.

The resolver feedback signal includes a sine feedback signal and a cosine feedback signal.

Step S13: Adjust the resolver feedback signal.

Step S14: Perform two-channel simultaneous sampling on an adjusted resolver feedback signal, separately calculate a first electrical angle and a second electrical angle, and diagnose data obtained after the two-channel sampling, the first electrical angle, and the second electrical angle in real time. If a diagnosis result is normal, step S15 is performed; or if a diagnosis result is abnormal, step S17 is performed.

Step S15: Sample the exciting signal and the adjusted resolver feedback signal to generate a corresponding feedback signal, and diagnose an exciting generation loop and a resolver feedback sampling loop based on the feedback signal. If a diagnosis result is normal, step S16 is performed; or if a diagnosis result is abnormal, step S17 is performed.

Step S16: Output the first electrical angle for torque control and output the second electrical angle for torque monitoring.

Step S17: Control the motor controller to enter the safe state.

Figure 7:
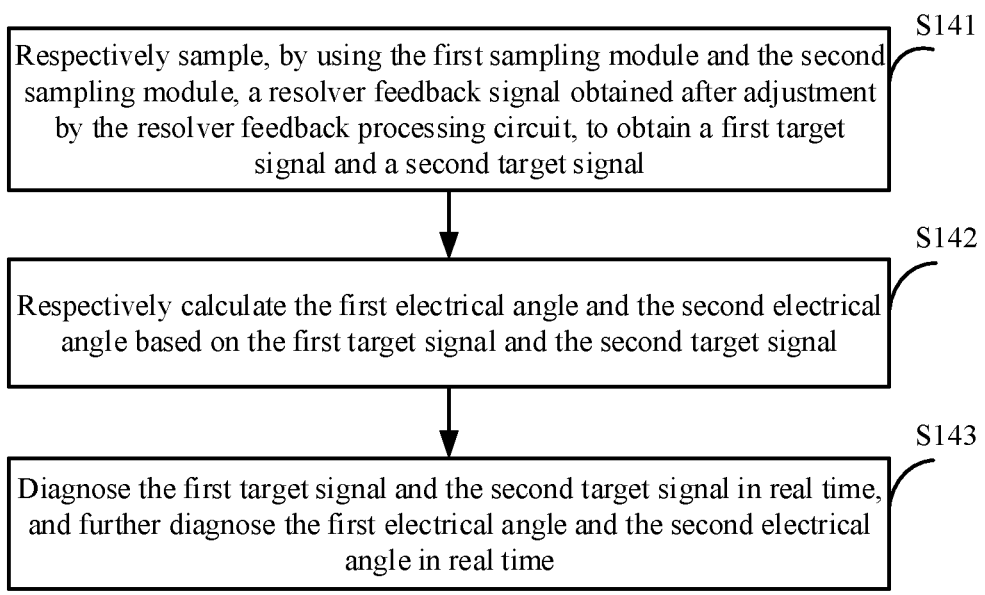
FIG. 7 is a sub flowchart of step S14 in FIG. 1.

In some implementations, to improve sampling accuracy and diagnosis coverage, the motor controller includes a first sampling module located at a basic functional layer and a second sampling module located at a monitoring layer, and the first sampling module is the same as the second sampling module. As shown in FIG. 7, in this implementation, step S14 in FIG. 6 includes the following steps:

Step S141: Respectively sample, by using the first sampling module and the second sampling module, the resolver feedback signal obtained after the adjustment by the resolver feedback processing circuit, to obtain a first target signal and a second target signal.

The first target signal includes a first target sine signal and a first target cosine signal, and the second target signal includes a second target sine signal and a second target cosine signal.

Step S142: Respectively calculate the first electrical angle and the second electrical angle based on the first target signal and the second target signal.

Step S143: Diagnose the first target signal and the second target signal in real time, and further diagnose the first electrical angle and the second electrical angle in real time.

Figure 8A:
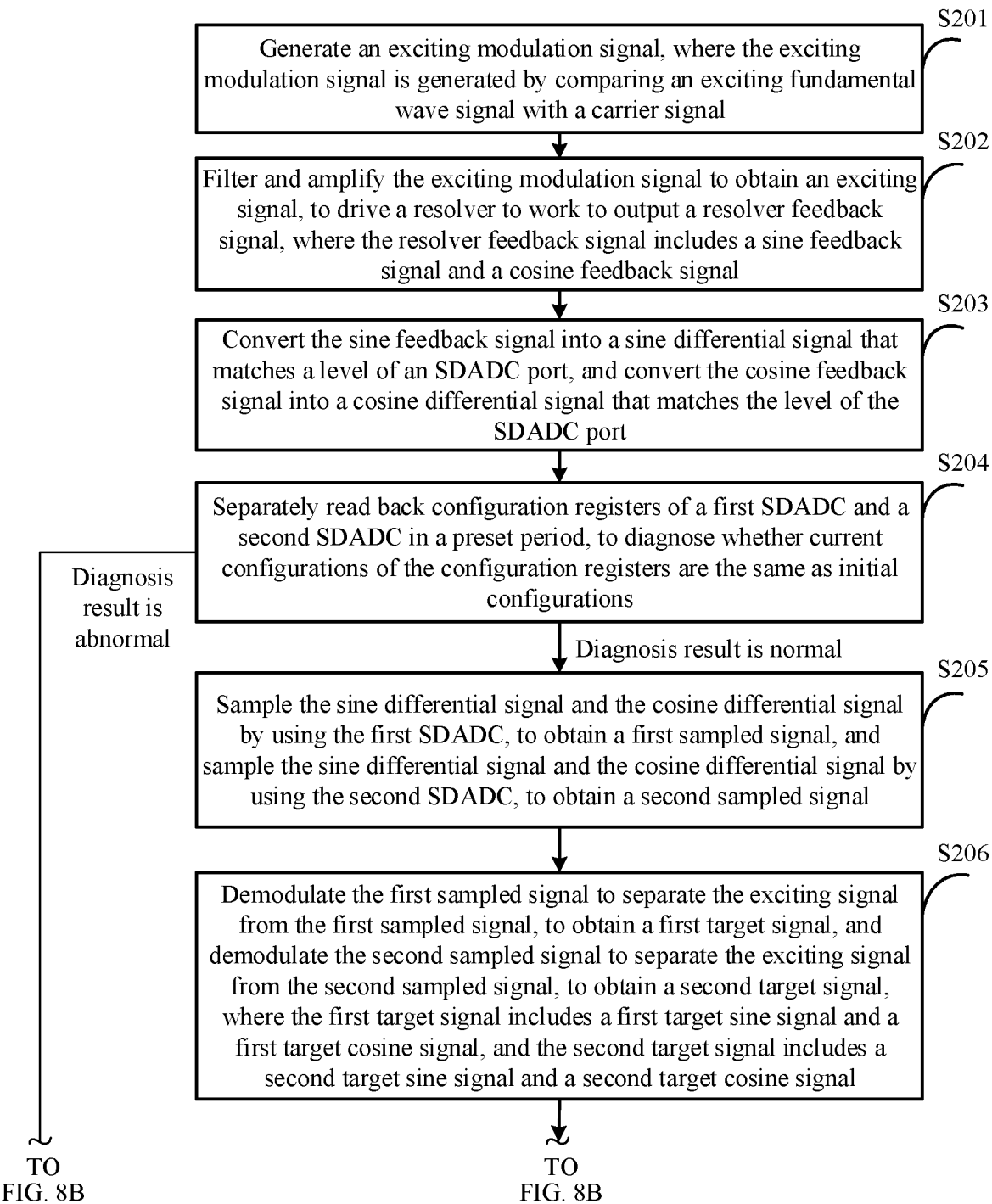
FIG. 8A and FIG. 8B are a flowchart of a motor angle detection and diagnosis method in another embodiment of this application.
Figure 8B:
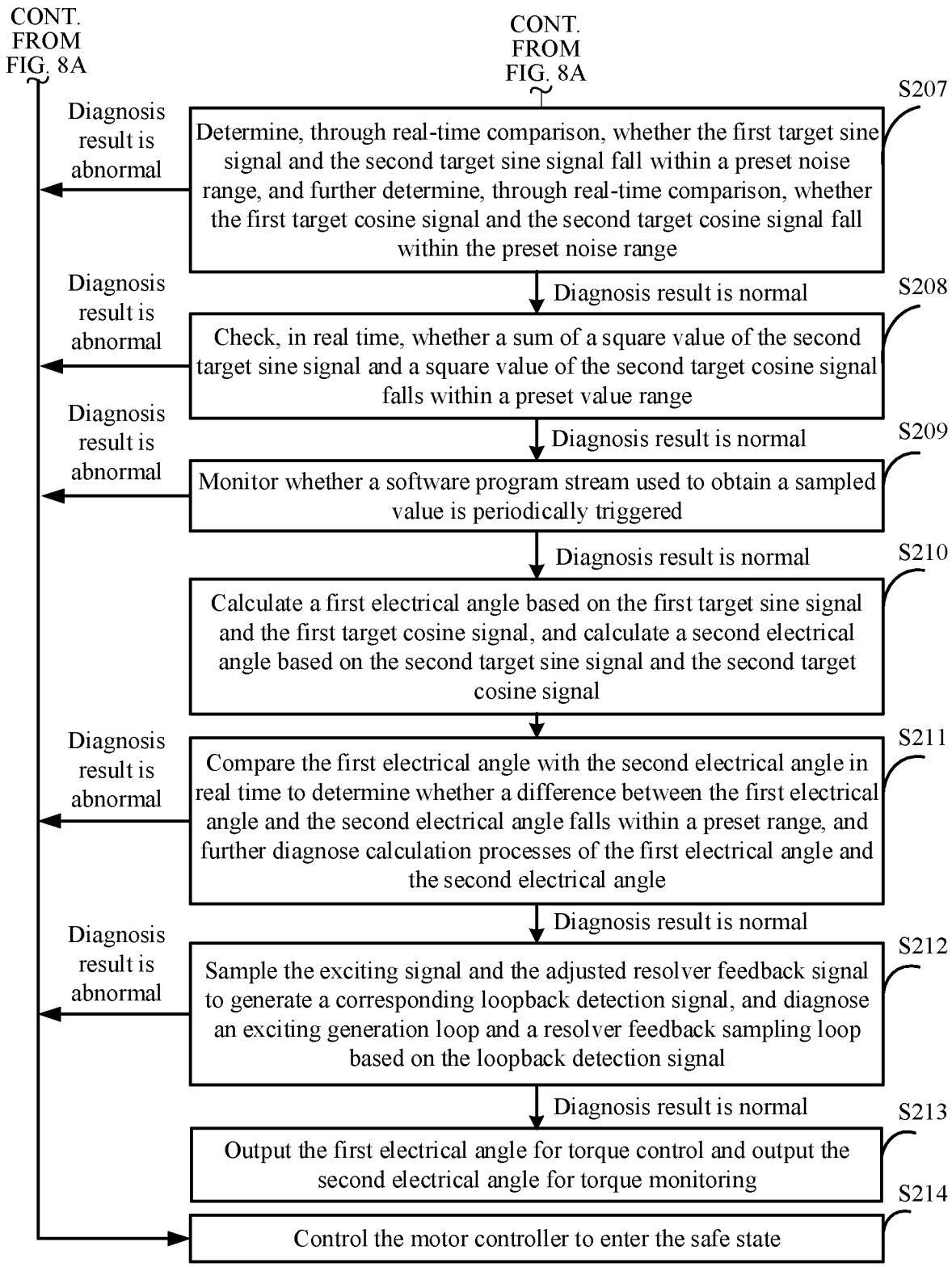

FIG. 8A and FIG. 8B are a flowchart of a motor angle detection and diagnosis method in another embodiment of this application. The motor angle detection and diagnosis method is applied to the motor angle detection and diagnosis apparatus 120b in FIG. 4. In this implementation, the motor angle detection and diagnosis method includes the following steps:

Step S201: Generate an exciting modulation signal, where the exciting modulation signal is generated by comparing an exciting fundamental wave signal with a carrier signal.

Step S202: Filter and amplify the exciting modulation signal to obtain an exciting signal, to drive the resolver to work to output the resolver feedback signal, where the resolver feedback signal includes a sine feedback signal and a cosine feedback signal.

Step S203: Convert the sine feedback signal into a sine differential signal that matches a level of an SDADC port, and convert the cosine feedback signal into a cosine differential signal that matches the level of the SDADC port.

Step S204: Separately read back configuration registers of a first SDADC and a second SDADC in a preset period, to diagnose whether current configurations of the configuration registers are the same as initial configurations. If a diagnosis result is normal, step S205 is performed; or if a diagnosis result is abnormal, step S214 is performed.

In this implementation, if the current configurations of the configuration registers are the same as the initial configurations, it is determined that the diagnosis result is normal; otherwise, it is determined that the diagnosis result is abnormal.

Step S205: Sample the sine differential signal and the cosine differential signal by using the first SDADC, to obtain a first sampled signal, and sample the sine differential signal and the cosine differential signal by using the second SDADC, to obtain a second sampled signal.

Step S206: Demodulate the first sampled signal to separate the exciting signal from the first sampled signal, to obtain a first target signal, and demodulate the second sampled signal to separate the exciting signal from the second sampled signal, to obtain a second target signal, where the first target signal includes a first target sine signal and a first target cosine signal, and the second target signal includes a second target sine signal and a second target cosine signal.

Step S207: Determine, through real-time comparison, whether the first target sine signal and the second target sine signal fall within a preset noise range, and further determine, through real-time comparison, whether the first target cosine signal and the second target cosine signal fall within the preset noise range. If a diagnosis result is normal, step S208 is performed; or if a diagnosis result is abnormal, step S214 is performed.

In this implementation, if comparison results of the first target sine signal and the second target sine signal fall within the preset noise range, and comparison results of the first target cosine signal and the second target cosine signal fall within the preset noise range, it is determined that the diagnosis result is normal; otherwise, it is determined that the diagnosis result is abnormal.

Step S208: Check, in real time, whether a sum of a square value of the second target sine signal and a square value of the second target cosine signal falls within a preset value range. If a diagnosis result is normal, step S209 is performed; or if a diagnosis result is abnormal, step S214 is performed.

In this implementation, if the sum of the square value of the second target sine signal and the square value of the second target cosine signal falls within the preset value range, it is determined that the diagnosis result is normal; otherwise, it is determined that the diagnosis result is abnormal.

Step S209: Monitor whether a software program stream used to obtain a sampled value is periodically triggered. If a diagnosis result is normal, step S210 is performed; or if a diagnosis result is abnormal, step S214 is performed.

In this implementation, if the software program stream used to obtain a sampled value is periodically triggered, it is determined that the diagnosis result is normal; otherwise, it is determined that the diagnosis result is abnormal.

Step S210: Calculate a first electrical angle based on the first target sine signal and the first target cosine signal, and calculate a second electrical angle based on the second target sine signal and the second target cosine signal.

Step S211: Compare the first electrical angle with the second electrical angle in real time to determine whether a difference between the first electrical angle and the second electrical angle falls within a preset range, and further diagnose calculation processes of the first electrical angle and the second electrical angle. If a diagnosis result is normal, step S212 is performed; or if a diagnosis result is abnormal, step S214 is performed.

In this implementation, if the difference between the first electrical angle and the second angle falls within the preset range and the calculation processes are normal, it is determined that the diagnosis result is normal; otherwise, it is determined that the diagnosis result is abnormal.

Step S212: Sample the exciting signal and the adjusted resolver feedback signal to generate a corresponding feedback signal, and diagnose an exciting generation loop and a resolver feedback sampling loop based on the feedback signal. If a diagnosis result is normal, step S213 is performed; or if a diagnosis result is abnormal, step S214 is performed.

In this implementation, if it is detected, by using the feedback signal, that the corresponding exciting signal and resolver feedback signal fall within an allowed range, it is determined that the diagnosis result is normal; otherwise, it is determined that the diagnosis result is abnormal.

Step S213: Output the first electrical angle for torque control and output the second electrical angle for torque monitoring.

Step S214: Control the motor controller to enter the safe state.

Figure 9A:
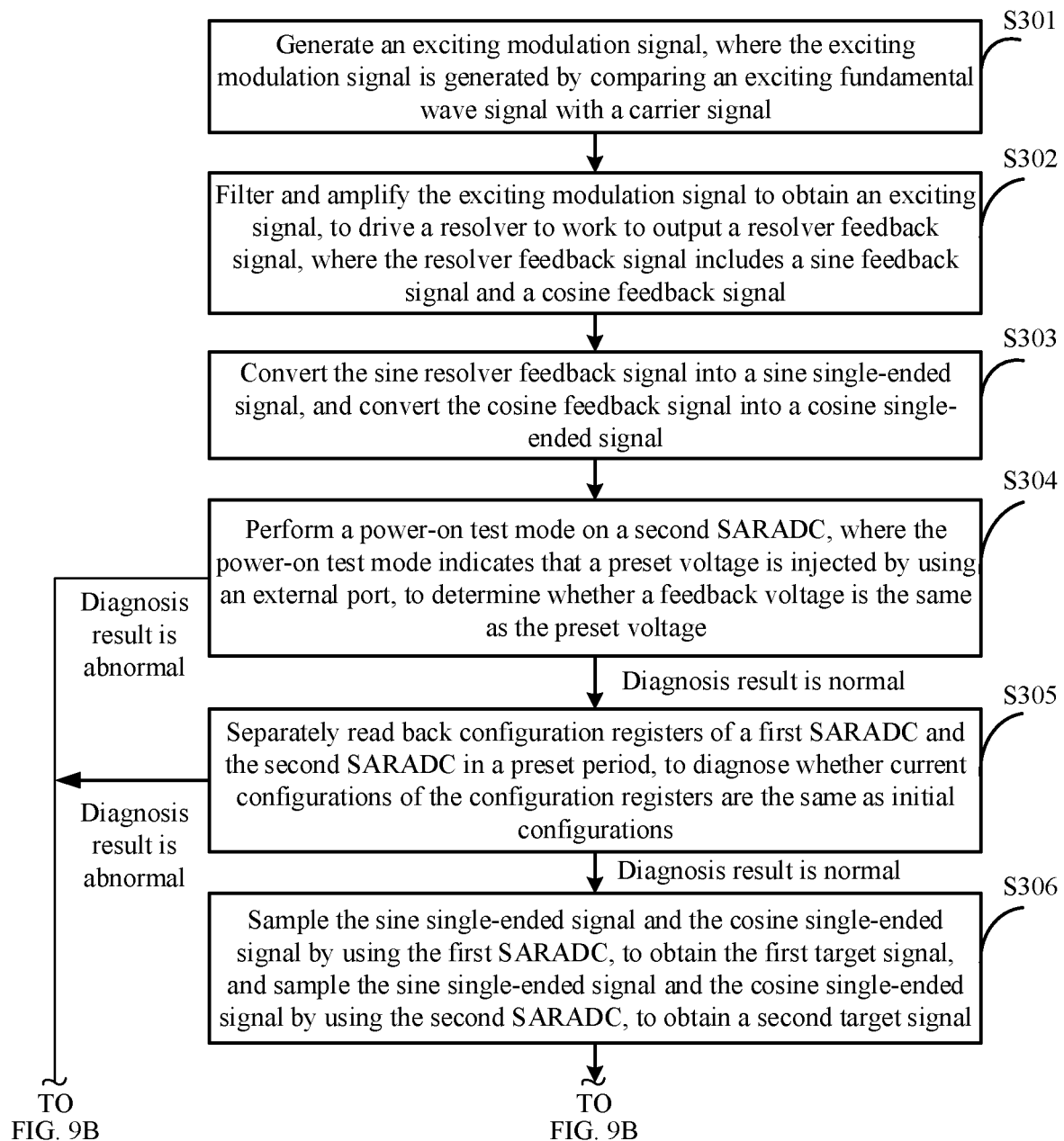
FIG. 9A and FIG. 9B are a flowchart of a motor angle detection and diagnosis method in still another embodiment of this application.
Figure 9B:
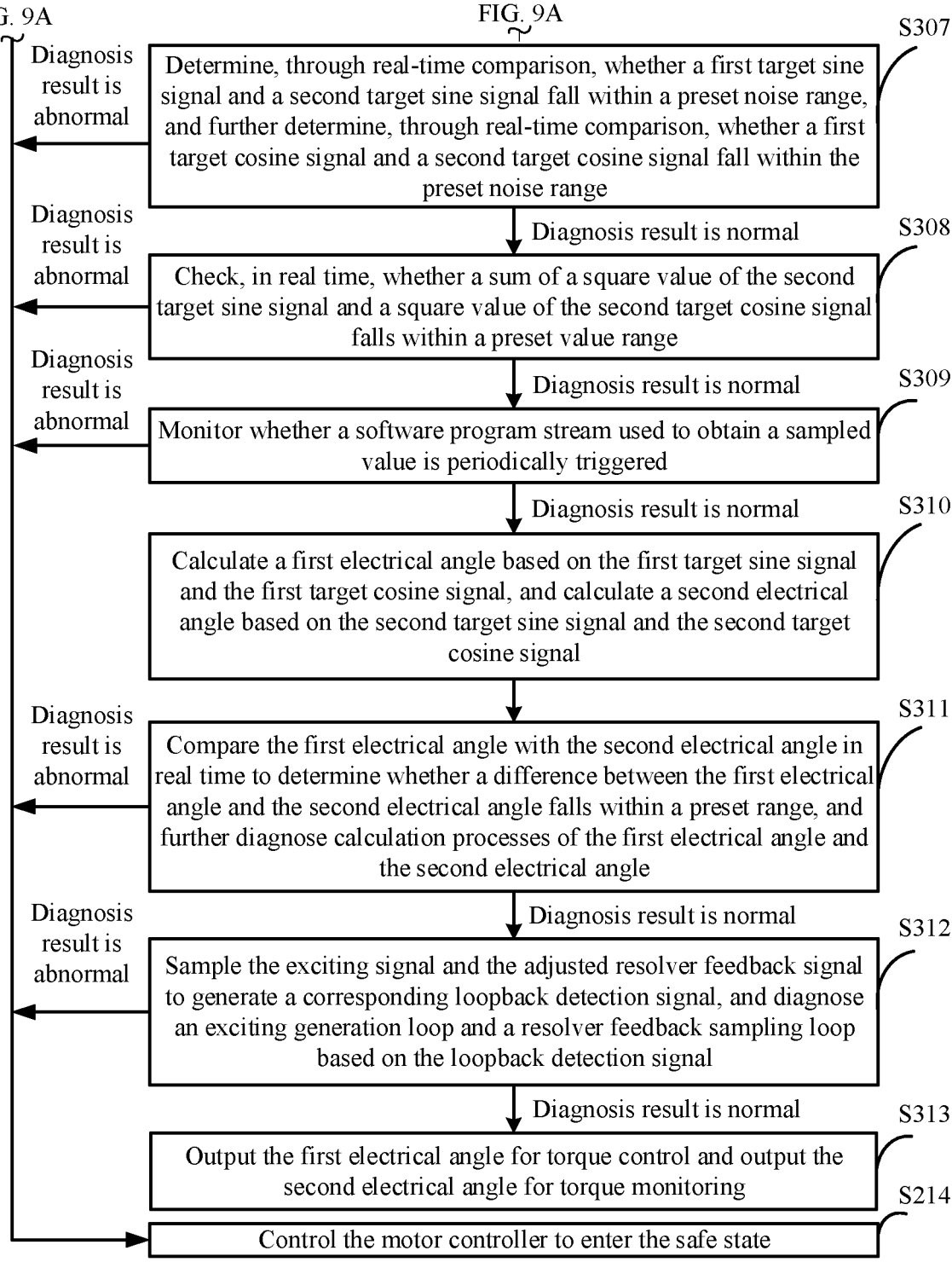

FIG. 9A and FIG. 9B are a flowchart of a motor angle detection and diagnosis method in still another embodiment of this application. The motor angle detection and diagnosis method is applied to the motor angle detection and diagnosis apparatus 120b in FIG. 5. In this implementation, the motor angle detection and diagnosis method includes the following steps:

Step S301: Generate an exciting modulation signal, where the exciting modulation signal is generated by comparing an exciting fundamental wave signal with a carrier signal.

Step S302: Filter and amplify the exciting modulation signal to obtain an exciting signal, to drive a resolver to work to output a resolver feedback signal, where the resolver feedback signal includes a sine feedback signal and a cosine feedback signal.

Step S303: Convert the sine resolver feedback signal into a sine single-ended signal, and convert the cosine feedback signal into a cosine single-ended signal.

Step S304: Perform a power-on test on a second SARADC, where the power-on test indicates that a preset voltage is injected by using an external port, to determine whether a feedback voltage is the same as the preset voltage. If a diagnosis result is normal, step 305 is performed; or if a diagnosis result is abnormal, step S314 is performed.

In this implementation, if the feedback voltage is the same as the preset voltage, it is determined that the diagnosis result is normal; otherwise, it is determined that the diagnosis result is abnormal.

Step S305: Separately read back configuration registers of a first SARADC and the second SARADC in a preset period, to diagnose whether current configurations of the configuration registers are the same as initial configurations. If a diagnosis result is normal, step 306 is performed; or if a diagnosis result is abnormal, step S314 is performed.

In this implementation, if the current configurations of the configuration registers are the same as the initial configurations, it is determined that the diagnosis result is normal; otherwise, it is determined that the diagnosis result is abnormal.

Step S306: Sample the sine single-ended signal and the cosine single-ended signal by using the first SARADC, to obtain the first target signal, and sample the sine single-ended signal and the cosine single-ended signal by using the second SARADC, to obtain a second target signal.

Step S307: Determine, through real-time comparison, whether a first target sine signal and a second target sine signal fall within a preset noise range, and further determine, through real-time comparison, whether a first target cosine signal and a second target cosine signal fall within the preset noise range. If a diagnosis result is normal, step 308 is performed; or if a diagnosis result is abnormal, step S314 is performed.

This step is similar to step S207. Details are not described herein again.

Step S308: Check, in real time, whether a sum of a square value of the second target sine signal and a square value of the second target cosine signal falls within a preset value range. If a diagnosis result is normal, step S309 is performed; or if a diagnosis result is abnormal, step S314 is performed.

This step is similar to step S208. Details are not described herein again.

Step S309: Monitor whether a software program stream used to obtain a sampled value is periodically triggered. If a diagnosis result is normal, step S310 is performed; or if a diagnosis result is abnormal, step S314 is performed.

This step is similar to step S309. Details are not described herein again.

Step S310: Calculate a first electrical angle based on the first target sine signal and the first target cosine signal, and calculate a second electrical angle based on the second target sine signal and the second target cosine signal.

Step S311: Compare the first electrical angle with the second electrical angle in real time to determine whether a difference between the first electrical angle and the second electrical angle falls within a preset range, and further diagnose calculation processes of the first electrical angle and the second electrical angle. If a diagnosis result is normal, step S312 is performed; or if a diagnosis result is abnormal, step S314 is performed.

This step is similar to step S211. Details are not described herein again.

Step S312: Sample the exciting signal and the adjusted resolver feedback signal to generate a corresponding feedback signal, and diagnose an exciting generation loop and a resolver feedback sampling loop based on the feedback signal. If a diagnosis result is normal, step S313 is performed; or if a diagnosis result is abnormal, step S314 is performed.

This step is similar to step S212. Details are not described herein again.

Step S313: Output the first electrical angle for torque control and output the second electrical angle for torque monitoring.

Step S314: Control the motor controller to enter the safe state.

It may be clearly understood by a person skilled in the art that, for the purpose of convenient and brief description, for a working process in the foregoing method implementations, refer to a corresponding process of each module in the foregoing apparatus embodiment. Details are not described herein again.

It should be noted that, for brief description, the foregoing method embodiments are represented as a series of actions. However, a person skilled in the art should appreciate that this application is not limited to the described order of the actions, because according to this application, some steps may be performed in other orders or simultaneously.

Order adjustment, combination, or deletion may be performed on the steps of the method in the embodiments of this application based on an actual requirement.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedures or functions according to this application are completely or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a Solid State Disk), or the like.

In conclusion, the foregoing descriptions are only embodiments of the technical solutions of the present disclosure, but are not intended to limit the protection scope of the present disclosure. Any modification, equivalent replacement, improvement, or the like made according to the disclosure herein shall fall within the protection scope of the present disclosure.

What is claimed is:

1. A motor angle detection and diagnosis apparatus for a motor controller to enable angle sampling to reach at least an automotive safety integrity level (ASIL) C function safety goal, the motor angle detection and diagnosis apparatus comprising:
a signal generation module configured to generate an exciting modulation signal, the exciting modulation signal is generated by comparing an exciting fundamental wave signal with a carrier signal;
a resolver exciting processing circuit, connected between the signal generation module and a resolver, the resolver exciting processing circuit configured to filter and amplify the exciting modulation signal to obtain an exciting signal, to drive the resolver to work;
a resolver feedback processing circuit connected to the resolver and receiving a resolver feedback signal of an electrical angle of the drive motor, the resolver feedback processing circuit configured to adjust the resolver feedback signal output by the resolver;
an angle sampling and diagnosis system, the angle sampling and diagnosis system configured to:
perform two-channel simultaneous sampling on the resolver feedback signal output obtained after the adjustment by the resolver feedback processing circuit;
separately calculate a first electrical angle and a second electrical angle, the first electrical angle being used for torque control and the second electrical angle being used for torque monitoring;
diagnose data obtained after the two-channel sampling of the first electrical angle and the second electrical angle in real time; and
control the motor controller to enter a safe state when diagnosing an abnormality;
a diagnosis signal sampling circuit connected to the resolver exciting processing circuit and to the resolver feedback processing circuit, the diagnosis signal sampling circuit configured to collect the exciting signal and the resolver feedback signal obtained after the adjustment by the resolver feedback processing circuit to generate a feedback signal; and
a first diagnosis module connected to the diagnosis signal sampling circuit, the first diagnosis module configured to:
diagnose an exciting generation loop and a resolver feedback sampling loop based on the feedback signal; and
control the motor controller to enter the safe state when diagnosing a fault.

2. The motor angle detection and diagnosis apparatus according to claim 1, wherein the angle sampling and diagnosis system comprises:
a first sampling module and a second sampling module configured to sample the resolver feedback signal obtained after the adjustment by the resolver feedback processing circuit to obtain a first target signal and a second target signal, wherein the first sampling module is located at a basic function layer, the second sampling module is located at a monitoring layer, and the first sampling module is the same as the second sampling module;
a first calculation module and a second calculation module configured to calculate the first electrical angle and the second electrical angle based on the first target signal and the second target signal; and
a second diagnosis module configured to diagnose the first target signal and the second target signal in real time, and configured to diagnose the first electrical angle and the second electrical angle in real time.

3. The motor angle detection and diagnosis apparatus according to claim 2, wherein the first sampling module comprises a first sigma delta ($\Sigma\Delta$) analog to digital converter (SD-ADC) and a first demodulation module, the second sampling module comprises a second SD-ADC and a second demodulation module, and the resolver feedback signal comprises a sine feedback signal and a cosine feedback signal;
the resolver feedback processing circuit is configured to convert the sine feedback signal into a sine differential signal that matches a level of an SD-ADC port, and is configured to convert the cosine feedback signal into a cosine differential signal that matches the level of the SD-ADC port;
the first SD-ADC is configured to sample the sine differential signal and the cosine differential signal to obtain a first sampled signal, and the first demodulation module is configured to demodulate the first sampled signal to separate the exciting signal from the first sampled signal to obtain the first target signal; and
the second SD-ADC is configured to sample the sine differential signal and the cosine differential signal to obtain a second sampled signal, and the second demodulation module is configured to demodulate the second sampled signal to separate the exciting signal from the second sampled signal to obtain the second target signal.

4. The motor angle detection and diagnosis apparatus according to claim 3, wherein the second diagnosis module is configured to separately read back configuration registers of the first SD-ADC and the second SD-ADC in a preset period to diagnose whether current configurations of the configuration registers are the same as initial configurations.

5. The motor angle detection and diagnosis apparatus according to claim 2, wherein the first sampling module comprises a first successive approximation register analog to digital converter (SAR-ADC), the second sampling module comprises a second SAR-ADC, and the resolver feedback signal comprises a sine feedback signal and a cosine feedback signal;
the resolver feedback processing circuit is configured to convert the sine resolver feedback signal into a sine single-ended signal, and is configured to convert the cosine feedback signal into a cosine single-ended signal;
the first SAR-ADC is configured to sample the sine single-ended signal and the cosine single-ended signal to obtain the first target signal; and
the second SAR-ADC is configured to sample the sine single-ended signal and the cosine single-ended signal to obtain the second target signal.

6. The motor angle detection and diagnosis apparatus according to claim 5, wherein the second diagnosis module is configured to perform a power-on test on the second SAR-ADC, wherein the power-on test indicates that a preset voltage is injected by using an external port to determine whether a feedback voltage is the same as the preset voltage.

7. The motor angle detection and diagnosis apparatus according to claim 5, wherein the second diagnosis module is configured to separately read back configuration registers of the first SAR-ADC and the second SAR-ADC in a preset period, to diagnose whether current configurations of the configuration registers are the same as initial configurations.

8. The motor angle detection and diagnosis apparatus according to claim 2, wherein the first target signal comprises a first target sine signal and a first target cosine signal, and the second target signal comprises a second target sine signal and a second target cosine signal; and
the second diagnosis module is configured to determine, through real-time comparison, whether the first target sine signal and the second target sine signal fall within a preset noise range, and is configured to determine, through real-time comparison, whether the first target cosine signal and the second target cosine signal fall within the preset noise range.

9. The motor angle detection and diagnosis apparatus according to claim 8, wherein the second diagnosis module is configured to check, in real time, whether a sum of a square value of the second target sine signal and a square value of the second target cosine signal falls within a preset value range.

10. The motor angle detection and diagnosis apparatus according to claim 2, wherein the second diagnosis module is configured to monitor whether a software program stream used to obtain a sampled value is periodically triggered.

11. The motor angle detection and diagnosis apparatus according to claim 2, wherein the second diagnosis module is configured to:
compare the first electrical angle with the second electrical angle in real time to determine whether a difference between the first electrical angle and the second electrical angle falls within a preset range; and
diagnose calculation processes of the first electrical angle and the second electrical angle.

12. The motor angle detection and diagnosis apparatus according to claim 1, wherein the feedback signal comprises a single-ended signal and a differential signal of the exciting signal; and the first diagnosis module is configured to detect a voltage range of the exciting modulation signal based on the single-ended signal of the exciting signal, and is configured to detect a frequency and a duty ratio of the exciting modulation signal based on the differential signal of the exciting signal, to diagnose the exciting generation loop; and
the feedback signal comprises a single-ended resolver feedback signal, and the first diagnosis module is configured to diagnose the resolver feedback sampling loop based on the single-ended resolver feedback signal.

13. A motor controller, comprising:
an inverter circuit including an input end and an output end, the input end of the inverter circuit being connected to a power battery, and an output end of the inverter circuit being connected to a drive motor, the inverter circuit is configured to convert a high-voltage direct current output from the power battery into an alternating current to enable the drive motor to work;
a motor angle detection and diagnosis apparatus, the motor angle detection and diagnosis apparatus enables angle sampling to reach at least an automotive safety integrity level (ASIL) C function safety goal, the motor angle detection and diagnosis apparatus comprising:
a signal generation module configured to generate an exciting modulation signal, the exciting modulation signal is generated by comparing an exciting fundamental wave signal with a carrier signal;
a resolver exciting processing circuit connected between the signal generation module and a resolver, the resolver exciting processing circuit configured to filter and amplify the exciting modulation signal to obtain an exciting signal, to drive the resolver to work;
a resolver feedback processing circuit connected to the resolver and receiving a resolver feedback signal of an electrical angle of the drive motor, the resolver feedback processing circuit configured to adjust the resolver feedback signal and generate a resolver feedback signal output;
an angle sampling and diagnosis system configured to:
perform two-channel simultaneous sampling on the resolver feedback signal output obtained after the adjustment by the resolver feedback processing circuit;
separately calculate a first electrical angle and a second electrical angle, the first electrical angle being used for torque control and the second electrical angle being used for torque monitoring;
diagnose data obtained after the two-channel sampling of the first electrical angle and the second electrical angle in real time; and
control the motor controller to enter a safe state when diagnosing an abnormality;
a diagnosis signal sampling circuit connected to the resolver exciting processing circuit and to the resolver feedback processing circuit, the diagnosis signal sampling circuit configured to collect the exciting signal and the resolver feedback signal obtained after the adjustment by the resolver feedback processing circuit, to generate a feedback signal; and
a first diagnosis module connected to the diagnosis signal sampling circuit, the first diagnosis module configured to:
diagnose an exciting generation loop and a resolver feedback sampling loop based on the feedback signal; and
control the motor controller to enter the safe state when diagnosing a fault.

14. The motor controller according to claim 13, wherein the angle sampling and diagnosis system comprises:
a first sampling module and a second sampling module configured to sample the resolver feedback signal obtained after the adjustment by the resolver feedback processing circuit to obtain a first target signal and a second target signal, wherein the first sampling module is located at a basic function layer, the second sampling module is located at a monitoring layer, and the first sampling module is the same as the second sampling module;
a first calculation module and a second calculation module configured to calculate the first electrical angle and the second electrical angle based on the first target signal and the second target signal; and
a second diagnosis module configured to diagnose the first target signal and the second target signal in real time, and configured to diagnose the first electrical angle and the second electrical angle in real time.

15. The motor controller according to claim 14, wherein the first sampling module comprises a first sigma delta ($\Sigma\Delta$) analog to digital converter (SD-ADC) and a first demodulation module, the second sampling module comprises a second SD-ADC and a second demodulation module, and the resolver feedback signal comprises a sine feedback signal and a cosine feedback signal;
the resolver feedback processing circuit is configured to convert the sine feedback signal into a sine differential signal that matches a level of an SD-ADC port, and is further configured to convert the cosine feedback signal into a cosine differential signal that matches the level of the SD-ADC port;

the first SD-ADC is configured to sample the sine differential signal and the cosine differential signal to obtain a first sampled signal, and the first demodulation module is configured to demodulate the first sampled signal to separate the exciting signal from the first sampled signal to obtain the first target signal; and the second SD-ADC is configured to sample the sine differential signal and the cosine differential signal to obtain a second sampled signal, and the second demodulation module is configured to demodulate the second sampled signal to separate the exciting signal from the second sampled signal to obtain the second target signal.

16. An electric vehicle, comprising:

a motor controller, the motor controller comprising an inverter circuit including an input end and an output end, the input end of the inverter circuit being connected to a power battery and the output end of the inverter circuit being connected to a drive motor, the inverter circuit is configured to convert a high-voltage direct current output from the power battery into an alternating current to enable the drive motor to work;

from a motor angle detection and diagnosis apparatus, the motor angle detection and diagnosis apparatus enables angle sampling to reach at least an automotive safety integrity level (ASIL) C function safety goal, the motor angle detection and diagnosis apparatus comprising:

a signal generation module configured to generate an exciting modulation signal, the exciting modulation signal is generated by comparing an exciting fundamental wave signal with a carrier signal;

a resolver exciting processing circuit connected between the signal generation module and a resolver, the resolver exciting processing circuit configured to filter and amplify the exciting modulation signal to obtain an exciting signal, to drive the resolver to work;

a resolver feedback processing circuit connected to the resolver and receiving a resolver feedback signal of an electrical angle of the drive motor, the resolver feedback processing circuit configured to adjust the resolver feedback signal and generate a resolver feedback signal output;

an angle sampling and diagnosis system configured to:
perform two-channel simultaneous sampling on the resolver feedback signal output obtained after the adjustment by the resolver feedback processing circuit;

separately calculate a first electrical angle and a second electrical angle, the first electrical angle being used for torque control and the second electrical angle being used for torque monitoring;

diagnose data obtained after the two-channel sampling of the first electrical angle and the second electrical angle in real time; and control the motor controller to enter a safe state when diagnosing an abnormality;

a diagnosis signal sampling circuit connected to the resolver exciting processing circuit and to the resolver feedback processing circuit, the diagnosis signal sampling circuit configured to collect the exciting signal and the resolver feedback signal obtained after the adjustment by the resolver feedback processing circuit, to generate a feedback signal; and a first diagnosis module connected to the diagnosis signal sampling circuit, the first diagnosis module configured to:
diagnose an exciting generation loop and a resolver feedback sampling loop based on the feedback signal; and
control the motor controller to enter the safe state when diagnosing a fault.

17. The vehicle according to claim 16, wherein the angle sampling and diagnosis system comprises:

a first sampling module and a second sampling module, configured to sample the resolver feedback signal obtained after the adjustment by the resolver feedback processing circuit to obtain a first target signal and a second target signal, wherein the first sampling module is located at a basic function layer, the second sampling module is located at a monitoring layer, and the first sampling module is the same as the second sampling module;

a first calculation module and a second calculation module configured to calculate the first electrical angle and the second electrical angle based on the first target signal and the second target signal; and a second diagnosis module configured to diagnose the first target signal and the second target signal in real time, and configured to diagnose the first electrical angle and the second electrical angle in real time.

18. The vehicle according to claim 17, wherein the first sampling module comprises a first sigma delta ($\Sigma\Delta$) analog to digital converter (SD-ADC) and a first demodulation module, the second sampling module comprises a second SD-ADC and a second demodulation module, and the resolver feedback signal comprises a sine feedback signal and a cosine feedback signal;

the resolver feedback processing circuit is configured to convert the sine feedback signal into a sine differential signal that matches a level of an SD-ADC port, and is configured to convert the cosine feedback signal into a cosine differential signal that matches the level of the SD-ADC port;

the first SD-ADC is configured to sample the sine differential signal and the cosine differential signal to obtain a first sampled signal, and the first demodulation module is configured to demodulate the first sampled signal to separate the exciting signal from the first sampled signal to obtain the first target signal; and the second SD-ADC is configured to sample the sine differential signal and the cosine differential signal to obtain a second sampled signal, and the second demodulation module is configured to demodulate the second sampled signal to separate the exciting signal from the second sampled signal to obtain the second target signal.

19. A motor angle detection and diagnosis method for a motor controller to enable angle sampling to reach at least an automotive safety integrity level (ASIL) C function safety goal, the motor angle detection and diagnosis method comprising:

generating an exciting modulation signal by comparing an exciting fundamental wave signal with a carrier signal;

filtering and amplifying the exciting modulation signal to obtain an exciting signal, to drive the resolver to work;

adjusting the resolver feedback signal and generating a resolver feedback signal output;

performing two-channel simultaneous sampling on the resolver feedback signal output obtained after the adjustment by the resolver feedback processing circuit;

separately calculating a first electrical angle and a second electrical angle;
diagnosing data obtained after the two-channel sampling of the first electrical angle and the second electrical angle in real time, the first electrical angle being used for torque control and the second electrical angle being used for torque monitoring;
sampling the exciting signal and the adjusted resolver feedback signal to generate a feedback signal, and diagnosing an exciting generation loop and a resolver feedback sampling loop based on the feedback signal; and
controlling the motor controller to enter a safe state when diagnosing a fault.

20. The motor angle detection and diagnosis method according to claim 19, wherein the motor controller comprises a first sampling module located at a basic function layer and a second sampling module located at a monitoring layer, and the first sampling module is the same as the second sampling module;
the performing the two-channel simultaneous sampling on the adjusted resolver feedback signal separately calculating the first electrical angle and the second electrical angle, and the diagnosing the data obtained after the two-channel sampling of the first electrical angle and the second electrical angle in real time comprises:
sampling, using the first sampling module and the second sampling module, the resolver feedback signal obtained after the adjustment by the resolver feedback processing circuit to obtain a first target signal and a second target signal;
calculating the first electrical angle and the second electrical angle based on the first target signal and the second target signal; and
diagnosing the first target signal and the second target signal in real time, and diagnosing the first electrical angle and the second electrical angle in real time.

21. The motor angle detection and diagnosis method according to claim 20, wherein the first sampling module comprises a first sigma delta (ΣΔ) analog to digital converter (SD-ADC), the second sampling module comprises a second SD-ADC, and the resolver feedback signal comprises a sine feedback signal and a cosine feedback signal;
the adjusting the resolver feedback signal output by the resolver comprises:
converting the sine feedback signal into a sine differential signal that matches a level of an SD-ADC port, and converting the cosine feedback signal into a cosine differential signal that matches the level of the SD-ADC port; and
the sampling, using the first sampling module and the second sampling module, the resolver feedback signal obtained after the adjustment by the resolver feedback processing circuit to obtain a first target signal and a second target signal comprises:
sampling the sine differential signal and the cosine differential signal using the first SD-ADC to obtain a first sampled signal, and sampling the sine differential signal and the cosine differential signal using the second SD-ADC to obtain a second sampled signal; and
demodulating the first sampled signal to separate the exciting signal from the first sampled signal to obtain the first target signal, and demodulating the second sampled signal to separate the exciting signal from the second sampled signal to obtain the second target signal.

22. The motor angle detection and diagnosis method according to claim 21, wherein the motor angle detection and diagnosis method comprises:
separately reading back configuration registers of the first SD-ADC and the second SD-ADC in a preset period to diagnose whether current configurations of the configuration registers are the same as initial configurations.

23. The motor angle detection and diagnosis method according to claim 20, wherein the first sampling module comprises a first SAR-ADC, the second sampling module comprises a second SAR-ADC, and the resolver feedback signal comprises the sine feedback signal and the cosine feedback signal;
the adjusting the resolver feedback signal output by the resolver comprises:
converting the sine resolver feedback signal into a sine single-ended signal and converting the cosine feedback signal into a cosine single-ended signal; and
the sampling, using the first sampling module and the second sampling module, the resolver feedback signal obtained after the adjustment by the resolver feedback processing circuit to obtain the first target signal and the second target signal comprises:
sampling the sine single-ended signal and the cosine single-ended signal using the first SAR-ADC to obtain the first target signal, and sampling the sine single-ended signal and the cosine single-ended signal using the second SAR-ADC to obtain the second target signal.

24. The motor angle detection and diagnosis method according to claim 23, wherein the motor angle detection and diagnosis method comprises:
performing a power-on test on the second SAR-ADC, wherein the power-on test indicates that a preset voltage is injected using an external port to determine whether a feedback voltage is the same as the preset voltage.

25. The motor angle detection and diagnosis method according to claim 23, wherein the motor angle detection and diagnosis method comprises:
separately reading back configuration registers of the first SAR-ADC and the second SAR-ADC in a preset period to diagnose whether current configurations of the configuration registers are the same as initial configurations.

26. The motor angle detection and diagnosis method according to claim 20, wherein the resolver feedback signal comprises the sine feedback signal and the cosine feedback signal, the first target signal comprises a first target sine signal and a first target cosine signal, and the second target signal comprises a second target sine signal and a second target cosine signal, and the diagnosing the first target signal and the second target signal in real time comprises:
determining, through real-time comparison, whether the first target sine signal and the second target sine signal fall within a preset noise range, and determining, through real-time comparison, whether the first target cosine signal and the second target cosine signal fall within the preset noise range.

27. The motor angle detection and diagnosis method according to claim 26, wherein the diagnosing the first target signal and the second target signal in real time comprises:
checking, in real time, whether a sum of a square value of the second target sine signal and a square value of the second target cosine signal falls within a preset value range.

28. The motor angle detection and diagnosis method according to claim 20, wherein the motor angle detection and diagnosis method comprises:
   monitoring whether a software program stream used to obtain a sampled value is periodically triggered.

29. The motor angle detection and diagnosis method according to claim 20, wherein the diagnosing the first electrical angle and the second electrical angle in real time comprises:
   comparing the first electrical angle with the second electrical angle in real time to determine whether a difference between the first electrical angle and the second electrical angle falls within a preset range; and
   diagnosing calculation processes of the first electrical angle and the second electrical angle.

30. The motor angle detection and diagnosis method according to claim 19, wherein the feedback signal comprises a single-ended signal and a differential signal of the exciting signal and a single-ended signal of the resolver feedback signal, and the diagnosing an exciting generation loop and a resolver feedback sampling loop based on the feedback signal comprises:
   detecting a voltage range of the exciting modulation signal based on the single-ended signal of the exciting signal, and detecting a frequency and a duty ratio of the exciting modulation signal based on the differential signal of the exciting signal to diagnose the exciting generation loop; and
   diagnosing the resolver feedback sampling loop based on the single-ended signal of the resolver feedback signal.

* * * * *